(12) United States Patent
Lee et al.

(10) Patent No.: US 11,495,652 B2
(45) Date of Patent: Nov. 8, 2022

(54) ORGANIC LIGHT EMITTING DIODE DISPLAY DEVICE AND METHOD OF MANUFACTURING ORGANIC LIGHT EMITTING DIODE DISPLAY DEVICE

(71) Applicant: Samsung Display Co., Ltd., Yongin-Si (KR)

(72) Inventors: Junhee Lee, Hwaseong-si (KR); Dongwon Kim, Seoul (KR); Deokhoi Kim, Seongnam-si (KR); Injun Bae, Seoul (KR); Hyemin Lee, Yongin-si (KR); Jihee Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/722,632

(22) Filed: Dec. 20, 2019

(65) Prior Publication Data
US 2020/0243635 A1    Jul. 30, 2020

(30) Foreign Application Priority Data

Jan. 28, 2019    (KR) .................. 10-2019-0010301

(51) Int. Cl.
*H01L 27/32*    (2006.01)
*G09G 3/3266*   (2016.01)
*H01L 27/12*    (2006.01)

(52) U.S. Cl.
CPC ....... *H01L 27/3272* (2013.01); *G09G 3/3266* (2013.01); *H01L 27/3258* (2013.01); *H01L 27/3262* (2013.01); *G09G 2300/0439* (2013.01); *H01L 27/1225* (2013.01); *H01L 2227/323* (2013.01)

(58) Field of Classification Search
CPC .................................................. H01L 27/3272
USPC ........................................................ 257/40
See application file for complete search history.

(56) References Cited

U.S. PATENT DOCUMENTS

| 11,251,247 | B2 * | 2/2022 | Kim | H01L 27/3258 |
|---|---|---|---|---|
| 2016/0300902 | A1 * | 10/2016 | You | H01L 27/3258 |
| 2017/0317156 | A1 * | 11/2017 | Kim | G09G 3/3233 |
| 2017/0352834 | A1 * | 12/2017 | Kim | H01L 51/0097 |
| 2017/0373124 | A1 * | 12/2017 | Yang | H01L 27/3246 |
| 2018/0033848 | A1 * | 2/2018 | Jung | H01L 27/3258 |
| 2018/0152818 | A1 | 5/2018 | Mills et al. | |

(Continued)

FOREIGN PATENT DOCUMENTS

| KR | 1020150051824 A | 5/2015 |
|---|---|---|
| KR | 1020180002274 A | 1/2018 |
| KR | 1020180013577 A | 2/2018 |

*Primary Examiner* — Hsin Yi Hsieh
(74) *Attorney, Agent, or Firm* — Cantor Colburn LLP

(57) ABSTRACT

An organic light emitting diode display device includes a substrate, a driving transistor, a switching transistor, a first light absorbing layer, an organic insulating layer, and a sub-pixel structure. The substrate includes a first region and a second region. The driving transistor is disposed in the first region on the substrate. The switching transistor is disposed in the second region on the substrate, and includes a metal-oxide-based semiconductor. The first light absorbing layer is disposed on the driving and switching transistors. The organic insulating layer is disposed directly on the first light absorbing layer. The sub-pixel structure is disposed on the organic insulating layer.

11 Claims, 17 Drawing Sheets

(56) References Cited

U.S. PATENT DOCUMENTS

2018/0152989 A1    5/2018   Holoubek et al.
2018/0204769 A1*   7/2018   Xu ..................... H01L 27/3258

* cited by examiner

ORGANIC LIGHT EMITTING DIODE DISPLAY DEVICE AND METHOD OF MANUFACTURING ORGANIC LIGHT EMITTING DIODE DISPLAY DEVICE

This application claims priority to Korean Patent Application No. 10-2019-0010301, filed on Jan. 28, 2019, and all the benefits accruing therefrom under 35 U.S.C. § 119, the content of which in its entirety is herein incorporated by reference.

BACKGROUND

1. Field

Exemplary embodiments relate generally to an organic light emitting diode display device and a method of manufacturing the organic light emitting diode display device. More particularly, embodiments of the invention relate to an organic light emitting diode display device including different types of transistors and a method of manufacturing the organic light emitting diode display device including different types of transistors.

2. Description of the Related Art

Flat panel display devices are widely used as display devices for replacing a cathode ray tube display device due to lightweight and thin characteristics thereof. Such flat panel display devices may include a liquid crystal display device and an organic light emitting diode display device.

Recently, organic light emitting diode display devices, which include both of silicon-based semiconductor elements and metal-oxide-based semiconductor elements are being developed. More particularly, in a sub-pixel circuit of the organic light emitting diode display device, a silicon-based semiconductor may be used as a driving transistor, and a metal-oxide-based semiconductor may be used as a switching transistor, for example.

SUMMARY

In an organic light emitting diode display device where a driving transistor includes a silicon-based semiconductor, and a switching transistor includes a metal-oxide-based semiconductor, light is incident on the metal-oxide-based semiconductor. For example, external light penetrating into the organic light emitting diode display device may be transmitted through a sub-pixel circuit, or a part of light emitted from a light emitting layer may be reflected from an upper electrode to be transmitted through the sub-pixel circuit. Accordingly, the transmitted light may be incident on the metal-oxide-based semiconductor. When light is incident on the metal-oxide-based semiconductor, the metal-oxide-based semiconductor may be rapidly deteriorated, and characteristics of the switching transistor including the metal-oxide-based semiconductor may be changed.

An exemplary embodiment provides an organic light emitting diode display device including different types of transistors.

An exemplary embodiment provides a method of manufacturing an organic light emitting diode display device including different types of transistors.

According to an exemplary embodiment, an organic light emitting diode display device includes a substrate, a driving transistor, a switching transistor, a first light absorbing layer, an organic insulating layer, and a sub-pixel structure. The substrate includes a first region and a second region. In such an embodiment, the driving transistor is disposed in the first region on the substrate. In such an embodiment, the switching transistor is disposed in the second region on the substrate, and includes a metal-oxide-based semiconductor. In such an embodiment, the first light absorbing layer is disposed on the driving and switching transistors. In such an embodiment, the organic insulating layer is disposed directly on the first light absorbing layer. In such an embodiment, the sub-pixel structure is disposed on the organic insulating layer.

In an exemplary embodiment, each of the driving and switching transistors may have a top gate structure.

In an exemplary embodiment, the driving transistor may include a first active layer including a first source region, a first drain region, and a first channel region, a first gate electrode overlapping the first channel region on the first active layer, a first source electrode disposed on the first gate electrode and connected to the first source region, and a first drain electrode disposed on the first gate electrode and connected to the first drain region. In such an embodiment, the first active layer may include a silicon-based semiconductor.

In an exemplary embodiment, the switching transistor may include a second active layer including a second source region, a second drain region, and a second channel region, a second gate electrode overlapping the second channel region on the second active layer, a second source electrode disposed on the second gate electrode and connected to the second source region, and a second drain electrode disposed on the second gate electrode and connected to the second drain region. In such an embodiment, the second active layer may include the metal-oxide-based semiconductor.

In an exemplary embodiment, the organic light emitting diode display device may further include an insulating pattern disposed between the second active layer and the second gate electrode.

In an exemplary embodiment, the organic light emitting diode display device may further include a first gate insulating layer disposed on the substrate to cover the first active layer in the first region and a second gate insulating layer disposed on the first gate insulating layer to cover the first gate electrode in the first region.

In an exemplary embodiment, the driving transistor may further include a gate electrode pattern overlapping the first gate electrode on the second gate insulating layer.

In an exemplary embodiment, the organic light emitting diode display device may further include a first insulating interlayer disposed on the second gate insulating layer to cover the gate electrode pattern in the first region and a second insulating interlayer disposed on the first insulating interlayer to cover the second active layer and the second gate electrode in the second region.

In an exemplary embodiment, the first source electrode, the first drain electrode, the second source electrode, and the second drain electrode may be disposed on the second insulating interlayer.

In an exemplary embodiment, the organic light emitting diode display device may further include a protective insulating layer disposed on the second insulating interlayer to cover the first source electrode, the first drain electrode, the second source electrode, and the second drain electrode.

In an exemplary embodiment, the organic light emitting diode display device may further include a planarization layer disposed on the protective insulating layer.

In an exemplary embodiment, the organic light emitting diode display device may further include a second light absorbing layer disposed between the protective insulating layer and the planarization layer.

In an exemplary embodiment, the sub-pixel structure may include a lower electrode, a light emitting layer disposed on the lower electrode, and an upper electrode disposed on the light emitting layer.

In an exemplary embodiment, the organic light emitting diode display device may further include a connection pattern disposed between the planarization layer and the first light absorbing layer. In such an embodiment, the connection pattern may be electrically connected to the lower electrode through a contact hole defined through a part of the first light absorbing layer and a part of the organic insulating layer.

In an exemplary embodiment, the substrate may include a first organic layer, a barrier layer disposed on the first organic layer, and a second organic layer disposed on the barrier layer.

In an exemplary embodiment, the organic light emitting diode display device may further include a buffer layer disposed on the substrate between the substrate and the driving and switching transistors.

In an exemplary embodiment, the organic light emitting diode display device may further include a thin film encapsulation structure disposed on the sub-pixel structure. In such an embodiment, the thin film encapsulation structure may include a first thin film encapsulation layer, a second thin film encapsulation layer, and a third thin film encapsulation layer. In such an embodiment, the first thin film encapsulation layer may include a flexible inorganic material. In such an embodiment, the second thin film encapsulation layer may be disposed on the first thin film encapsulation layer, and may include a flexible organic material. In such an embodiment, the third thin film encapsulation layer may be disposed on the second thin film encapsulation layer, and may include a flexible inorganic material.

According to an exemplary embodiment, a method of manufacturing an organic light emitting diode display device includes: preparing a substrate including a first region and a second region; providing a driving transistor in the first region on the substrate; providing a switching transistor including a metal-oxide-based semiconductor in the second region on the substrate; providing a planarization layer on the driving transistor and the switching transistor; providing a connection pattern on the planarization layer; providing a light absorbing layer on the planarization layer to cover the connection pattern; providing an organic insulating layer having a first thickness on the light absorbing layer; forming a first contact hole through the organic insulating layer, which exposes a part of a top surface of the light absorbing layer, by performing a light exposure process using a mask; forming a second contact hole through the light absorbing layer, which exposes a part of a top surface of the connection pattern through the first contact hole, by performing a dry etching process; and providing a sub-pixel structure on the light absorbing layer.

In an exemplary embodiment, the first thickness of the organic insulating layer may be reduced to a second thickness during the dry etching process.

In an exemplary embodiment, the sub-pixel structure may include a lower electrode, a light emitting layer disposed on the lower electrode, and an upper electrode disposed on the light emitting layer. In such an embodiment, the connection pattern may be electrically connected to the lower electrode through the first and second contact holes.

In exemplary embodiments of the invention, the organic light emitting diode display device includes the light absorbing layer, such that the organic light emitting diode display device may block the light incident on the second active layer. Accordingly, the organic light emitting diode display device may protect the second active layer including the oxide-based semiconductor, and may maintain the characteristics of the switching transistor.

In exemplary embodiments of the method of manufacturing the organic light emitting diode display device, the second contact hole may be formed in the light absorbing layer by forming the organic insulating layer having the first contact hole on the light absorbing layer. Accordingly, organic light emitting diode display device includes the light absorbing layer, such that the light incident on the second active layer may be blocked.

BRIEF DESCRIPTION OF THE DRAWINGS

An exemplary embodiment can be understood in more detail from the following description taken in conjunction with the accompanying drawings, in which.

DETAILED DESCRIPTION OF THE EMBODIMENTS

Figure 1:
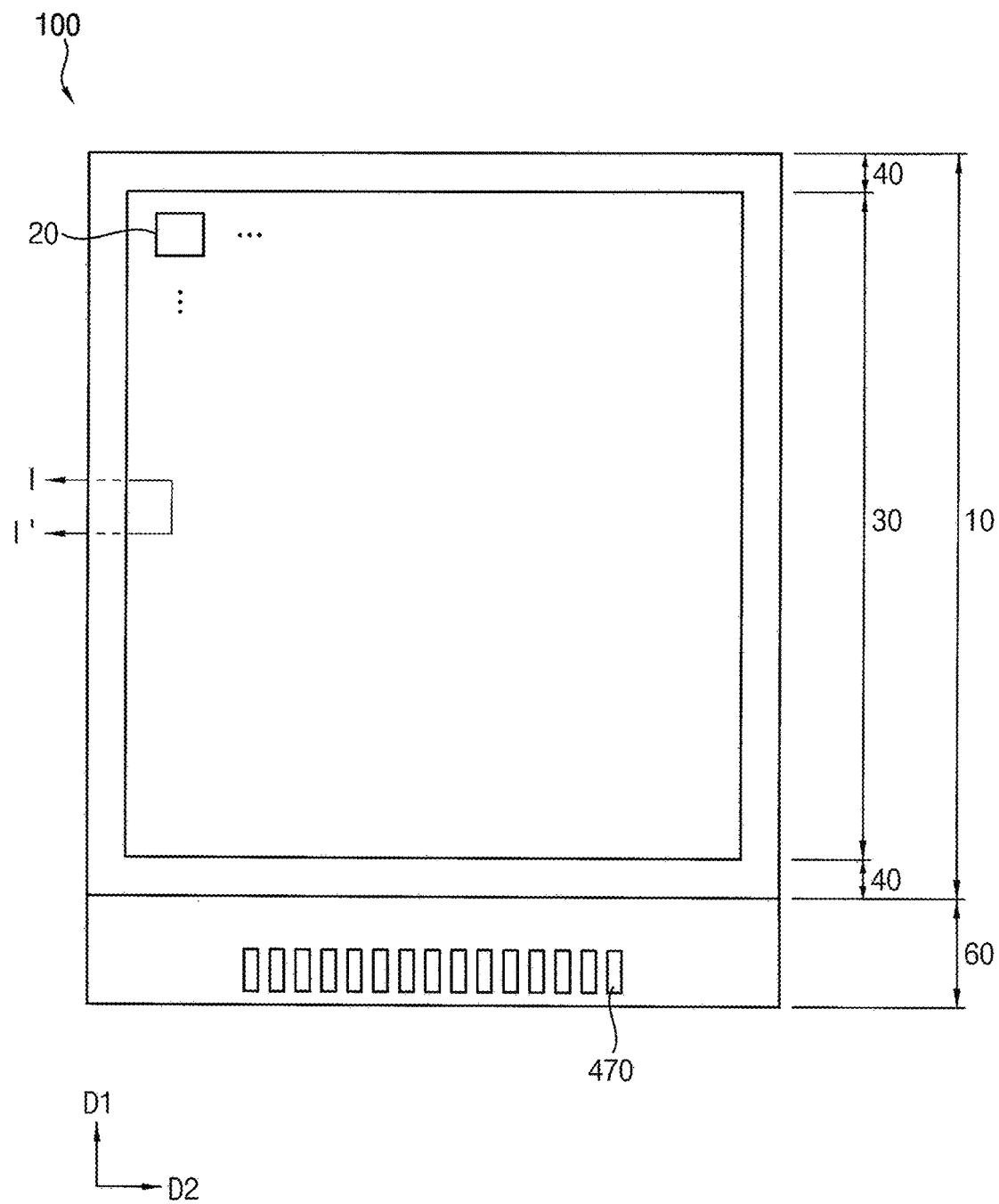
FIG. 1 is a plan view showing an organic light emitting diode display device according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be explained in detail with reference to the accompanying drawings.

Figure 2:
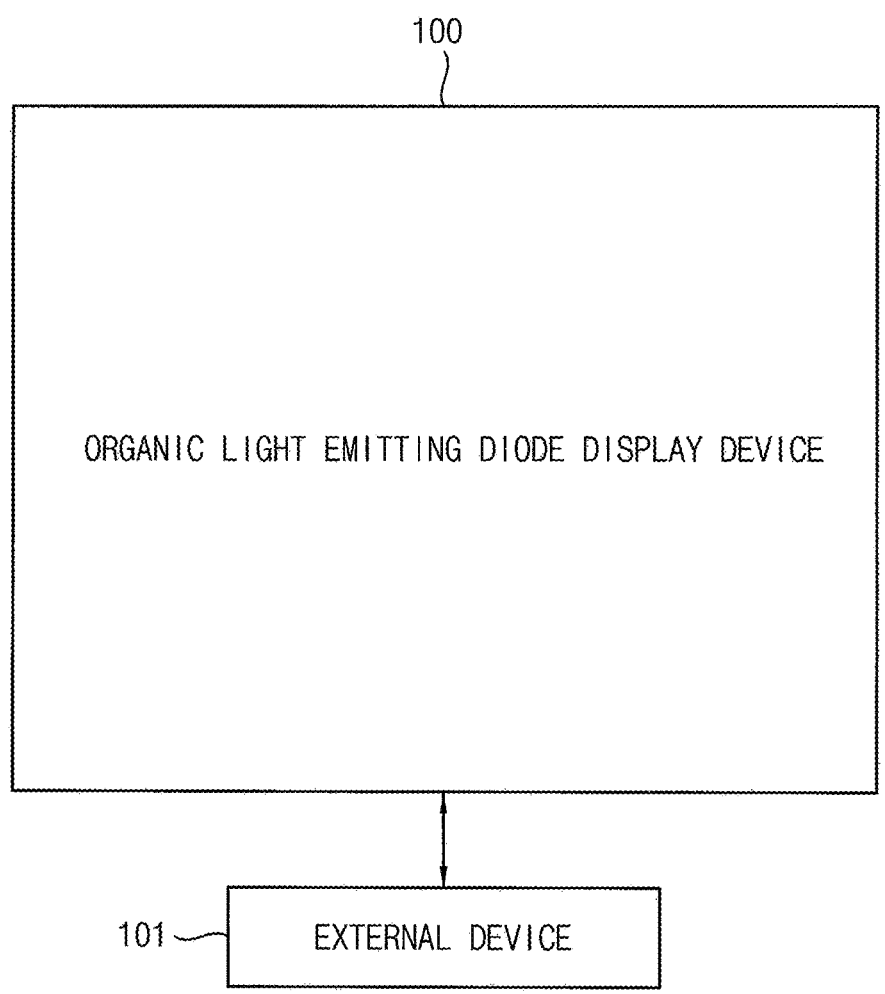
FIG. 2 is a block diagram showing an external device electrically connected to the organic light emitting diode display device of FIG. 1.

FIG. 1 is a plan view showing an organic light emitting diode display device according to an exemplary embodiment of the invention, and FIG. 2 is a block diagram showing an external device electrically connected to the organic light emitting diode display device of FIG. 1.

Referring to FIGS. 1 and 2, an exemplary embodiment of an organic light emitting diode ("OLED") display device 100 (e.g., substrate 110 of FIG. 4) may include a display region 10 and a pad region 60. The display region 10 may include a light emitting region 30 including a plurality of sub-pixel circuit regions 20 and a peripheral region 40 surrounding the light emitting region 30, where the sub-pixel circuit regions 20 may be arranged on the light emitting region 30 in a first direction D1 parallel to a top surface of the OLED display device 100 and a second direction D2 orthogonal to the first direction D1. In one exemplary embodiment, for example, a sub-pixel circuit of FIG. 3 (e.g., driving transistor 250 and switching transistor 255 of FIG. 4) may be disposed in each of the sub-pixel circuit regions 20, and an OLED (e.g., sub-pixel structure 200 of FIG. 4) may be disposed on the sub-pixel circuit. An image may be displayed on the display region 10 through the sub-pixel circuit and the OLED.

In one exemplary embodiment, for example, first, second, and third sub-pixel circuits may be disposed in the sub-pixel circuit regions 20. The first sub-pixel circuit may be connected to a first OLED for emitting red light, the second sub-pixel circuit may be connected to a second OLED for emitting green light, and the third sub-pixel circuit may be connected to a third OLED for emitting blue light.

In an exemplary embodiment, the first OLED may overlap the first sub-pixel circuit, the second OLED may overlap the second sub-pixel circuit, and the third OLED may overlap the third sub-pixel circuit. Alternatively, the first OLED may overlap a part of the first sub-pixel circuit and a part of other sub-pixel circuits different from the first sub-pixel circuit, the second OLED may overlap a part of the second sub-pixel circuit and a part of other sub-pixel circuits different from the second sub-pixel circuit, and the third OLED may overlap a part of the third sub-pixel circuit and a part of other sub-pixel circuits different from the third sub-pixel circuit. Herein, "overlap" may mean "overlap when viewed from a plan view in a thickness direction of the OLED display device." In one exemplary embodiment, for example, the first to third OLEDs may be arranged based on an RGB stripe scheme in which red, green and blue OLEDs having an identical size are arranged in order, an S-stripe scheme including a blue OLED having a relatively large area, a WRGB scheme further including a white OLED, a PenTile scheme in which RG-GB patterns are repeatedly arranged, etc.

In such an embodiment, at least one driving transistor, at least one switching transistor, at least one capacitor, and the like may be disposed in each of the sub-pixel circuit regions 20. In one exemplary embodiment, for example, a single driving transistor (e.g., first transistor TR1 of FIG. 3) and six switching transistors (e.g., second to seventh transistors TR2, TR3, TR4, TR5, TR6, and TR7 of FIG. 3), a single storage capacitor (e.g., storage capacitor CST of FIG. 3), and the like may be disposed in each of the sub-pixel circuit regions 20.

In an exemplary embodiment, each of the display region 10, the peripheral region 40, and the sub-pixel circuit region 20 may have a rectangular plane shape, as shown in FIG. 1, but the shape is not limited thereto. In one exemplary embodiment, for example, each of the display region 10, the peripheral region 40, and the sub-pixel circuit region 20 may have a triangular shape, a rhombic shape, a polygonal shape, a circular shape, a track shape, or an elliptical shape when viewed from a top plan view or a plan view in the thickness direction of the OLED display device 100.

In such an embodiment, a plurality of wires may be disposed in the peripheral region 40. In one exemplary embodiment, for example, the wires may include a data signal wire, a gate signal wire, a light emission control signal wire, a gate initialization signal wire, an initialization voltage wire, a power supply voltage wire, etc. The wires may extend from the peripheral region 40 to the light emitting region 30, and may be electrically connected to the sub-pixel circuit and the OLED. In such an embodiment, a gate driver, a data driver, and the like may be disposed in the peripheral region 40.

The pad region 60 may be located on one side of the display region 10, and pad electrodes 470 electrically connected to an external device 101 may be disposed. In such an embodiment, the pad electrodes 470 may electrically connect the external device 101 to the sub-pixel circuit. In an exemplary embodiment, the OLED display device 100 may have a constant width in a lateral direction (e.g., second direction D2).

In an alternative exemplary embodiment, a bending region may be defined between the pad region 60 and the display region 10. Connection electrodes may be disposed in the bending region, and the bending region may be bent on an axis with respect to the second direction D2 such that the pad region 60 is located on a bottom surface of the OLED display device 100. In such an embodiment, when the pad region 60 is located on the bottom surface of the OLED display device 100, the bending region may have a curved shape. In such an embodiment, a width of the bending region and the pad region 60 in the lateral direction may be smaller than a width of the display region 10 in the lateral direction.

In an exemplary embodiment, as shown in FIG. 1, the peripheral region 40 surrounding the light emitting region 30 may have a constant width, but the configuration of the invention is not limited thereto. In one exemplary embodiment, for example, the peripheral region 40 may include a first peripheral region extending in the second direction D2 and a second peripheral region extending in the first direction D1. In such an embodiment, the first peripheral region of the peripheral region 40 may be adjacent to a top of the light emitting region 30 and the pad region 60, and the second peripheral region of the peripheral region 40 may be located on both sides of the light emitting region 30 (e.g., left and right sides of light emitting region 30). In such an embodiment, a width of the second region in the lateral direction may be relatively smaller than a width of the first region in a longitudinal direction (e.g., first direction D1).

The external device 101 may be electrically connected to the OLED display device 100 through a flexible printed circuit board or a printed circuit board. In one exemplary embodiment, for example, one side of the flexible printed circuit board may make direct contact with the pad electrodes 470, and an opposite side of the flexible printed circuit board may make direct contact with the external device 101. The external device 101 may provide a data signal, a gate signal, a light emission control signal, a gate initialization signal, an initialization voltage, a power supply voltage, and the like to the OLED display device 100. In such an embodiment, a driver integrated circuit may be mounted on the flexible printed circuit board. In an alternative exemplary embodiment, the driver integrated circuit may be mounted on the OLED display device 100 adjacent to the pad electrodes 470.

Figure 3:
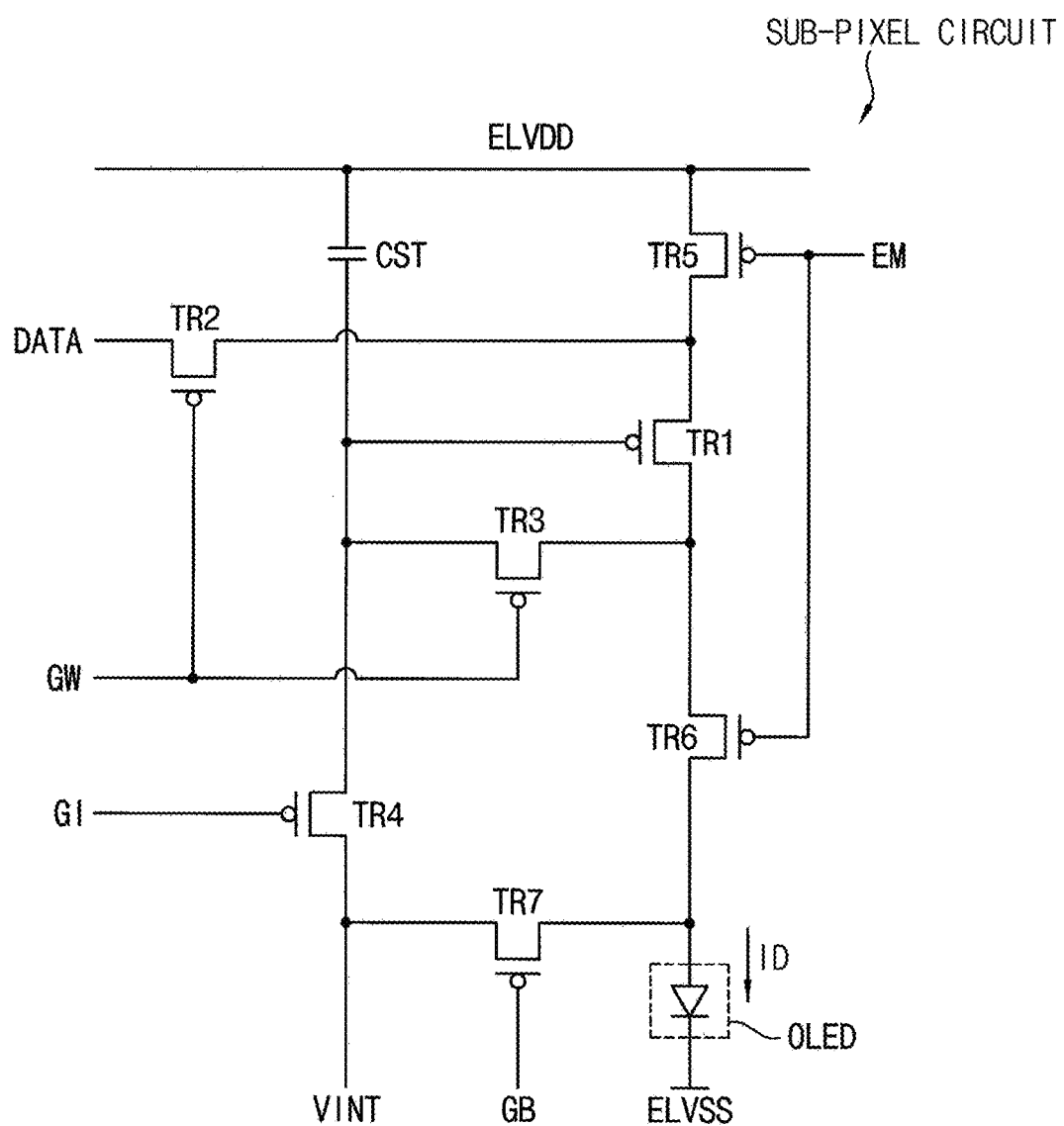
FIG. 3 is a circuit diagram showing the sub-pixel circuit and the organic light emitting diode disposed in the sub-pixel circuit region of FIG. 1.

FIG. 3 is a circuit diagram showing the sub-pixel circuit and the OLED disposed in the sub-pixel circuit region of FIG. 1.

Referring to FIG. 3, a sub-pixel circuit SPC and an organic light emitting diode OLED (e.g., sub-pixel structure 200 of FIG. 4) may be disposed in each of the sub-pixel circuit regions 20 of the organic light emitting diode OLED display device 100, and one sub-pixel circuit SPC may include first to seventh transistors TR1, TR2, TR3, TR4, TR5, TR6, and TR7, a storage capacitor CST, a wire for a high power supply voltage ELVDD, a wire for a low power supply voltage ELVSS, a wire for an initialization voltage VINT, a wire for a data signal DATA, a wire for a gate signal GW, a wire for a gate initialization signal GI, a wire for a light emission control signal EM, a wire for a diode initialization signal GB, etc.

The organic light emitting diode OLED may output light based on a driving current ID. The organic light emitting diode OLED may include a first terminal and a second terminal. In an exemplary embodiment, the second terminal of the organic light emitting diode OLED may be supplied with the low power supply voltage ELVSS. In one exemplary embodiment, for example, the first terminal of the organic light emitting diode OLED may be an anode terminal, and the second terminal of the organic light emitting diode OLED may be a cathode terminal. Alternatively, the first terminal of the organic light emitting diode OLED may be the cathode terminal, and the second terminal of the organic light emitting diode OLED may be the anode terminal. In an exemplary embodiment, the anode terminal of the organic light emitting diode OLED may correspond to a lower electrode 290 of FIG. 4, and the cathode terminal of the organic light emitting diode OLED may correspond to an upper electrode 340 of FIG. 4.

The first transistor TR1 (e.g., corresponding to driving transistor 250 of FIG. 4) may include a gate terminal, a first terminal, and a second terminal. In the exemplary embodiments, the first terminal of the first transistor TR1 may be a source terminal, and the second terminal of the first transistor TR1 may be a drain terminal. Alternatively, the first terminal of the first transistor TR1 may be the drain terminal, and the second terminal of the first transistor TR1 may be the source terminal.

The first transistor TR1 may generate the driving current ID. In an exemplary embodiment, the first transistor TR1 may operate in a saturation region. In such an embodiment, the first transistor TR1 may generate the driving current ID based on a voltage difference between the gate terminal and the source terminal. In such an embodiment, a gradation or grayscale may be expressed based on a magnitude of the driving current ID supplied to the organic light emitting diode OLED. Alternatively, the first transistor TR1 may operate in a linear region. In such an embodiment, the gradation may be expressed based on the sum of times during which the driving current is supplied to the organic light emitting diode OLED within one frame.

The second transistor TR2 may include a gate terminal, a first terminal, and a second terminal. The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. In one exemplary embodiment, for example, the gate signal GW may be provided from a gate driver, and the gate signal GW may be applied to the gate terminal of the second transistor TR2 through the wire for the gate signal GW. In an exemplary embodiment, the first terminal of the second transistor TR2 may be a source terminal, and the second terminal of the second transistor TR2 may be a drain terminal. Alternatively, the first terminal of the second transistor TR2 may be the drain terminal, and the second terminal of the second transistor TR2 may be the source terminal.

The second transistor TR2 may supply the data signal DATA to the first terminal of the first transistor TR1 during an activation period of the gate signal GW. In such an embodiment, the second transistor TR2 may operate in a linear region.

The third transistor TR3 may include a gate terminal, a first terminal, and a second terminal. The gate terminal of the third transistor TR3 may be supplied with the gate signal GW. The first terminal of the third transistor TR3 may be connected to the gate terminal of the first transistor TR1. The second terminal of the third transistor TR3 may be connected to the second terminal of the first transistor TR1. In one exemplary embodiment, for example, the gate signal GW may be provided from the gate driver, and the gate signal GW may be applied to the gate terminal of the third transistor TR3 through the wire for the gate signal GW. In an exemplary embodiment, the first terminal of the third transistor TR3 may be a source terminal, and the second terminal of the third transistor TR3 may be a drain terminal. Alternatively, the first terminal of the third transistor TR3 may be the drain terminal, and the second terminal of the third transistor TR3 may be the source terminal.

The third transistor TR3 may connect the gate terminal of the first transistor TR1 to the second terminal of the first transistor TR1 during the activation period of the gate signal GW. In such an embodiment, the third transistor TR3 may operate in a linear region. In such an embodiment, the third transistor TR3 may diode-connect the first transistor TR1 during the activation period of the gate signal GW. Since the first transistor TR1 is diode-connected, a voltage difference between the first terminal of the first transistor TR1 and the gate terminal of the first transistor TR1 may be substantially equal to a threshold voltage of the first transistor TR1. As a result, a voltage obtained by adding the voltage difference (i.e., threshold voltage) to a voltage of the data signal DATA supplied to the first terminal of the first transistor TR1 may be supplied to the gate terminal of the first transistor TR1 during the activation period of the gate signal GW. In such an embodiment, the data signal DATA may be compensated as much as the threshold voltage of the first transistor TR1, and the compensated data signal DATA may be supplied to the gate terminal of the first transistor TR1. As the threshold voltage compensation is performed, a problem of a non-uniform driving current caused by a threshold voltage deviation of the first transistor TR1 may be effectively prevented. In an exemplary embodiment, the third transistor TR3 may correspond to a switching transistor 255 of FIG. 3. In such an embodiment, a channel of the third transistor TR3 may include a metal oxide semiconductor.

An input terminal of the initialization voltage wire provided with the initialization voltage VINT may be connected to a first terminal of the fourth transistor TR4 and a first terminal of the seventh transistor TR7, and an output terminal of the initialization voltage wire may be connected to a second terminal of the fourth transistor TR4 and a first terminal of the storage capacitor CST.

The fourth transistor TR4 may include a gate terminal, a first terminal, and a second terminal. The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1. In an exemplary embodiment, the first terminal of the fourth transistor TR4 may be a source terminal, and the second terminal of the fourth transistor TR4 may be a drain terminal. Alternatively, the first terminal of the fourth transistor TR4 may be the drain terminal, and the second terminal of the fourth transistor TR4 may be the source terminal.

The fourth transistor TR4 may supply the initialization voltage VINT to the gate terminal of the first transistor TR1 during an activation period of the gate initialization signal GI. In such an embodiment, the fourth transistor TR4 may operate in a linear region. In such an embodiment, the fourth transistor TR4 may initialize the gate terminal of the first transistor TR1 to the initialization voltage VINT during the activation period of the gate initialization signal GI. In an exemplary embodiment, the initialization voltage VINT may have a voltage level sufficiently lower than a voltage level of the data signal DATA maintained by the storage capacitor CST in a previous frame, and the initialization voltage VINT may be supplied to the gate terminal of the first transistor TR1 which is a p-channel metal oxide semiconductor transistor (PMOS transistor). In an alternative exemplary embodiment, the initialization voltage may have a voltage level sufficiently higher than the voltage level of the data signal maintained by the storage capacitor in the previous frame, and the initialization voltage may be supplied to the gate terminal of the first transistor which is an n-channel metal oxide semiconductor transistor (NMOS transistor).

In an exemplary embodiment, the gate initialization signal GI may be a signal substantially identical to the gate signal GW transmitted before one horizontal time. In one exemplary embodiment, for example, the gate initialization signal GI supplied to a sub-pixel circuit in an $n^{th}$ row (here, n is an integer of 2 or greater) among the sub-pixel circuits included in the OLED display device 100 may be a signal substantially identical to the gate signal GW supplied to a sub-pixel circuit in an $(n-1)^{th}$ row among the sub-pixel circuits. In such an embodiment, an activated gate initialization signal GI may be supplied to a first sub-pixel circuit in the $n^{th}$ row among the sub-pixel circuits SPC by supplying an activated gate signal GW to a first sub-pixel circuit in the $(n-1)^{th}$ row among the sub-pixel circuits SPC. As a result, the data signal DATA may be supplied to the sub-pixel circuit in the (n-1)th row among the sub-pixel circuits SPC while the gate terminal of the first transistor TR1 included in the sub-pixel circuit in the $n^{th}$ row among the sub-pixel circuits SPC are initialized to the initialization voltage VINT. Alternatively, the fourth transistor TR4 may correspond to a switching transistor 255 of FIG. 4. In such an embodiment, a channel of the fourth transistor TR4 may include a metal oxide semiconductor.

The fifth transistor TR5 may include a gate terminal, a first terminal, and a second terminal. The gate terminal may be supplied with the light emission control signal EM. The first terminal may be connected to the wire for the high power supply voltage ELVDD. The second terminal may be connected to the first terminal of the first transistor TR1. In one exemplary embodiment, for example, the light emission control signal EM may be provided from a light emission control driver, and the light emission control signal EM may be applied to the gate terminal of the fifth transistor TR5 through the wire for the light emission control signal EM. In an exemplary embodiment, the first terminal of the fifth transistor TR5 may be a source terminal, and the second terminal of the fifth transistor TR5 may be a drain terminal. Alternatively, the first terminal of the fifth transistor TR5 may be the drain terminal, and the second terminal of the fifth transistor TR5 may be the source terminal.

The fifth transistor TR5 may supply the high power supply voltage ELVDD to the first terminal of the first transistor TR1 during an activation period of the light emission control signal EM. In such an embodiment, the fifth transistor TR5 may shut off the supply of the high power supply voltage ELVDD during a deactivation period of the light emission control signal EM. In this case, the fifth transistor TR5 may operate in a linear region. The fifth transistor TR5 supplies the high power supply voltage ELVDD to the first terminal of the first transistor TR1 during the activation period of the light emission control signal EM, so that the first transistor TR1 may generate the driving current ID. In such an embodiment, the fifth transistor TR5 shuts off the supply of the high power supply voltage ELVDD during the deactivation period of the light emission control signal EM, so that the data signal DATA supplied to the first terminal of the first transistor TR1 may be supplied to the gate terminal of the first transistor TR1.

The sixth transistor TR6 may include a gate terminal, a first terminal, and a second terminal. The gate terminal may be supplied with the light emission control signal EM. The first terminal may be connected to the second terminal of the first transistor TR1. The second terminal may be connected to the first terminal of the organic light emitting diode OLED. In one exemplary embodiment, for example, the light emission control signal EM may be provided from the light emission control driver, and the light emission control signal EM may be applied to the gate terminal of the sixth transistor TR6 through the wire for the light emission control signal EM. In an exemplary embodiment, the first terminal of the sixth transistor TR6 may be a source terminal, and the second terminal of the sixth transistor TR6 may be a drain terminal. Alternatively, the first terminal of the sixth transistor TR6 may be the drain terminal, and the second terminal of the sixth transistor TR6 may be the source terminal.

The sixth transistor TR6 may supply the driving current ID generated by the first transistor TR1 to the organic light emitting diode OLED during the activation period of the light emission control signal EM. In such an embodiment, the sixth transistor TR6 may operate in a linear region. In such an embodiment, the sixth transistor TR6 supplies the driving current ID generated by the first transistor TR1 to the organic light emitting diode OLED during the activation period of the light emission control signal EM, such that the organic light emitting diode OLED may output light. In such an embodiment, the sixth transistor TR6 electrically separates the first transistor TR1 from the organic light emitting diode OLED during the deactivation period of the light emission control signal EM, such that the data signal DATA supplied to the second terminal of the first transistor TR1 (more particularly, data signal which has been subject to threshold voltage compensation) may be supplied to the gate terminal of the first transistor TR1.

The seventh transistor TR7 may include a gate terminal, a first terminal, and a second terminal. The gate terminal may be supplied with the diode initialization signal GB. The first terminal may be supplied with the initialization voltage VINT. The second terminal may be connected to the first terminal of the organic light emitting diode OLED. In an exemplary embodiment, the first terminal of the seventh transistor TR7 may be a source terminal, and the second terminal of the seventh transistor TR7 may be a drain terminal. Alternatively, the first terminal of the seventh transistor TR7 may be the drain terminal, and the second terminal of the seventh transistor TR7 may be the source terminal.

The seventh transistor TR7 may supply the initialization voltage VINT to the first terminal of the organic light emitting diode OLED during an activation period of the diode initialization signal GB. In such an embodiment, the seventh transistor TR7 may operate in the linear region. In such an embodiment, the seventh transistor TR7 may initialize the first terminal of the organic light emitting diode OLED to the initialization voltage VINT during the activation period of the diode initialization signal GB.

Alternatively, the gate initialization signal GI and the diode initialization signal GB may be signals substantially identical to each other. An operation of initializing the gate terminal of the first transistor TR1 and an operation of initializing the first terminal of the organic light emitting diode OLED may not affect each other. In such an embodiment, the operation of initializing the gate terminal of the first transistor TR1 and the operation of initializing the first terminal of the organic light emitting diode OLED may be independent of each other. Accordingly, the diode initialization signal GB is not separately generated, such that efficiency of a process may be improved.

The storage capacitor CST may include a first terminal and a second terminal. The storage capacitor CST may be connected between the wire for the high power supply voltage ELVDD and the gate terminal of the first transistor TR1. In one exemplary embodiment, for example, the first terminal of the storage capacitor CST may be connected to the gate terminal of the first transistor TR1, and the second terminal of the storage capacitor CST may be connected to the wire for the high power supply voltage ELVDD. The storage capacitor CST may maintain a voltage level of the gate terminal of the first transistor TR1 during a deactivation period of the gate signal GW. The deactivation period of the gate signal GW may include the activation period of the light emission control signal EM, and the driving current ID generated by the first transistor TR1 may be supplied to the organic light emitting diode OLED during the activation period of the light emission control signal EM. Therefore, the driving current ID generated by the first transistor TR1 may be supplied to the organic light emitting diode OLED based on the voltage level maintained by the storage capacitor CST.

In an exemplary embodiment, as described above, the sub-pixel circuit SPC may include the seven transistors and the single storage capacitor, the configuration of exemplary embodiment of the invention is not limited thereto. In one exemplary embodiment, for example, the sub-pixel circuit SPC may have a configuration including two or more transistor and two or more storage capacitor.

Figure 4:
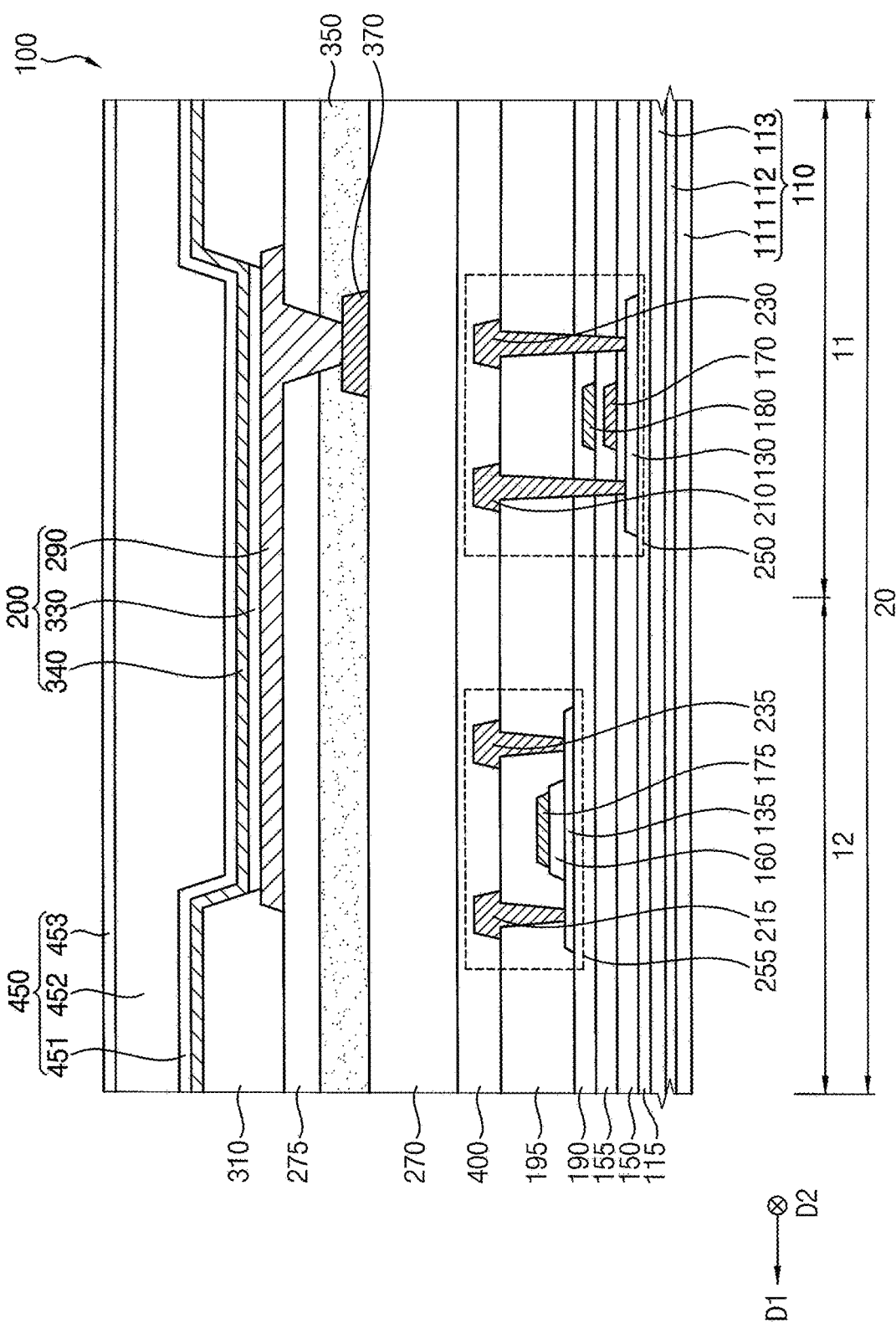
FIG. 4 is a sectional view taken along line I-I' of the organic light emitting diode display device of FIG. 1.

FIG. 4 is a sectional view taken along line I-I' of the organic light emitting diode display device of FIG. 1.

Referring to FIG. 4, an exemplary embodiment of the OLED display device 100 may include a substrate 110, a buffer layer 115, a driving transistor 250, a switching transistor 255, a gate electrode pattern 180, a first gate insulating layer 150, a second gate insulating layer 155, a first insulating interlayer 190, an insulating pattern 160, a second insulating interlayer 195, a protective insulating layer 400, a planarization layer 270, a connection pattern 370, a light absorbing layer 350, an organic insulating layer 275, a sub-pixel structure 200, a pixel defining layer 310, a thin film encapsulation structure 450, etc. In such an embodiment, the substrate 110 may include a first organic layer 111, a barrier layer 112, and a second organic layer 113. Since the OLED display device 100 includes the display region 10, which includes the light emitting region 30 and the peripheral region 40, and the pad region 60, the substrate 110 may also be divided into the display region 10 and the pad region 60. The driving transistor 250 may include a first active layer 130, a first gate electrode 170, a first source electrode 210, and a first drain electrode 230, and the switching transistor 255 may include a second active layer 135, a second gate electrode 175, a second source electrode 215, and a second drain electrode 235. In such an embodiment, the sub-pixel structure 200 may include a lower electrode 290, a light emitting layer 330, and an upper electrode 340, and the thin film encapsulation structure 450 may include a first thin film encapsulation layer 451, a second thin film encapsulation layer 452, and a third thin film encapsulation layer 453.

In such an embodiment, where the OLED display device 100 includes a flexible substrate 110 and the thin film encapsulation structure 450, the OLED display device 100 may function as a flexible organic light emitting diode display device.

The OLED display device 100 includes the first organic layer 111. The first organic layer 111 may include a flexible organic material. In an exemplary embodiment, the first organic layer 111 may include polyimide, for example.

The barrier layer 112 may be disposed on the first organic layer 111. The barrier layer 112 may block moisture penetrating through the first organic layer 111. The barrier layer 112 may include a flexible inorganic material. In an exemplary embodiment, the barrier layer 112 may include silicon oxide or silicon nitride, for example.

The second organic layer 113 may be disposed on the barrier layer 112. The second organic layer 113 may be disposed on the barrier layer 112. The second organic layer 113 may include a flexible organic material. In an exemplary embodiment, the second organic layer 113 may include polyimide, for example.

In such an embodiment, the first organic layer 111, the barrier layer 112, and the second organic layer 113 may collectively defined the substrate 110. In an exemplary embodiment, the substrate 110 may have a first region 11 and a second region 12, where the first region 11 may be adjacent to the second region 12. In one exemplary embodiment, for example, the first region 11 may be a region where the driving transistor is disposed, and the second region 12 may be a region where the switching transistor is disposed.

In an exemplary embodiment, as shown in FIG. 4, the substrate 110 may have a multilayer structure including three layers, but not being limited thereto. In one exemplary embodiment, for example, the substrate 110 may include a single layer or at least two layers.

In an alternative exemplary embodiment, the substrate 110 may include a transparent or opaque material. In one exemplary embodiment, for example, the substrate 110 may include a quartz substrate, a synthetic quartz substrate, a calcium fluoride substrate, a fluorine-doped quartz substrate (F-doped quartz substrate), a soda lime glass substrate or a non-alkali glass substrates.

The buffer layer 115 may be disposed in the first region 11 and the second region 12 on the substrate 110. In one exemplary embodiment, for example, the buffer layer 115 may be disposed on the substrate 110. The buffer layer 115 may effectively prevent metal atoms or impurities from being diffused from the substrate 110 into the driving transistor 250, the switching transistor 255, and the sub-pixel structure 200, and may control a heat transfer rate during a crystallization process for forming the first active layer 130 to obtain a substantially uniform first active layer 130. In such an embodiment, the buffer layer 115 may serve to improve flatness of a surface of the substrate 110 when the surface of the substrate 110 is not uniform. Depending on a type of the substrate 110, at least two buffer layers 115 may be provided on the substrate 110, or the buffer layer 115 may not be provided on the substrate 110. In one exemplary embodiment, for example, the buffer layer 115 may include an organic material or an inorganic material. In an exemplary embodiment, the buffer layer 115 may include the inorganic material.

The first active layer 130 may be disposed in the first region 11 on the buffer layer 115. In one exemplary embodiment, for example, the first active layer 130 may include a metal oxide semiconductor, an amorphous silicon, a polysilicon or an organic semiconductor. In an exemplary embodiment, the first active layer 130 may include a silicon-based semiconductor, e.g., the amorphous silicon or the polysilicon. In an exemplary embodiment, the first active layer 130 may have a first source region, a first drain region, and a first channel region located between the first source region and the first drain region.

The first gate insulating layer 150 may be disposed in the first region 11 and the second region 12 on the buffer layer 115 and the first active layer 130. In one exemplary embodiment, for example, the first gate insulating layer 150 may be disposed on the entire buffer layer 115. The first gate insulating layer 150 may sufficiently cover the first active layer 130 on the buffer layer 115, and may have a substantially flat top surface without a step defined around the first active layer 130. Alternatively, the first gate insulating layer 150 may cover the first active layer 130 on the buffer layer 115, and may be disposed with a substantially uniform thickness along a profile of the first active layer 130. The first gate insulating layer 150 may include a silicon compound or a metal oxide, for example. In one exemplary embodiment, for example, the first gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$) or titanium oxide ($TiO_x$). Alternatively, the first gate insulating layer 150 may have a multilayer structure having a plurality of insulating layers including materials which are different from each other.

The first gate electrode 170 may be disposed in the first region 11 on the gate insulating layer 150. In such an embodiment, the first gate electrode 170 may be disposed on a portion of the gate insulating layer 150 under which the first active layer 130 is located (e.g., first channel region). The first gate electrode 170 may include a metal, an alloy of a metal, a metal nitride, a conductive metal oxide or a transparent conductive material, for example. In one exemplary embodiment, the first gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide ("ITO"), tin oxide ($SnO_x$), indium oxide ($InO_x$), gallium oxide (GaO$_x$) or indium zinc oxide ("IZO"), for example. Such materials may be used alone or in combination with each other. Alternatively, the first gate electrode 170 may have a multilayer structure including a plurality of layers.

The second gate insulating layer 155 may be disposed in the first region 11 and the second region 12 on the first gate insulating layer 150 and the first gate electrode 170. In one exemplary embodiment, for example, the second gate insulating layer 155 may be disposed on the entire first gate insulating layer 150. The second gate insulating layer 155 may sufficiently cover the first gate electrode 170 on the first gate insulating layer 150, and may have a substantially flat top surface without a step defined around the first gate electrode 170. Alternatively, the second gate insulating layer 155 may cover the first gate electrode 170 on the first gate insulating layer 150, and may be disposed with a substantially uniform thickness along a profile of the first gate electrode 170. The second gate insulating layer 155 may include a silicon compound or a metal oxide, for example. Alternatively, the second gate insulating layer 155 may have a multilayer structure having a plurality of insulating layers including materials which are different from each other.

The gate electrode pattern 180 may be disposed in the first region 11 on the second gate insulating layer 155. In such an embodiment, the gate electrode pattern 180 may be disposed on a portion of the second gate insulating layer 155 under which the first gate electrode 170 is located. In another sectional view of the OLED display device 100, the first gate electrode 170 and the gate electrode pattern 180 may function as the storage capacitor CST of FIG. 3. The gate electrode pattern 180 may include a metal, an alloy of a metal, a metal nitride, a conductive metal oxide or a transparent conductive material, for example. Alternatively, the gate electrode pattern 180 may have a multilayer structure including a plurality of layers.

The first insulating interlayer 190 may be disposed in the first region 11 and the second region 12 on the second gate insulating layer 155 and the gate electrode pattern 180. In one exemplary embodiment, for example, the first insulating interlayer 190 may be disposed on the entire second gate insulating layer 155. The first insulating interlayer 190 may sufficiently cover the gate electrode pattern 180 on the second gate insulating layer 155, and may have a substantially flat top surface without a step defined around the gate electrode pattern 180. Alternatively, the first insulating interlayer 190 may cover the gate electrode pattern 180 on the second gate insulating layer 155, and may be disposed with a substantially uniform thickness along a profile of the gate electrode pattern 180. The first insulating interlayer 190 may include a silicon compound or a metal oxide, for example. Alternatively, the first insulating interlayer 190 may have a multilayer structure having a plurality of insulating layers including materials which are different from each other.

The second active layer 135 may be disposed in the second region 12 on the first insulating interlayer 190. The second active layer 135 may include a metal oxide semiconductor. In such an embodiment, the second active layer 135 may be a semiconductor oxide layer including a binary compound (AB$_x$), a ternary compound (AB$_x$C$_y$), a quaternary compound (AB$_x$C$_y$D$_z$), or the like containing indium (In), zinc (Zn), gallium (Ga), tin (Sn), titanium (Ti), aluminum (Al), hafnium (Hf), zirconium (Zr) or magnesium (Mg), for example. In one exemplary embodiment, for example, the second active layer 135 may include zinc oxide (ZnO$_x$), gallium oxide (GaO$_x$), titanium oxide (TiO$_x$), tin oxide (SnO$_x$), indium oxide (InO$_x$), indium-gallium oxide ("IGO"), indium-zinc oxide ("IZO"), indium-tin oxide ("ITO"), gallium-zinc oxide ("GZO"), zinc-magnesium oxide ("ZMO"), zinc-tin oxide ("ZTO"), zinc-zirconium oxide (ZnZr$_x$O$_y$), indium-gallium-zinc oxide ("IGZO"), indium-zinc-tin oxide ("IZTO"), indium-gallium-hafnium oxide ("MHO"), tin-aluminum-zinc oxide ("TAZO") or indium-gallium-tin oxide ("IGTO"). In an exemplary embodiment, the second active layer 135 may have a second source region, a second drain region, and a second channel region located between the second source region and the second drain region.

The insulating pattern 160 may be disposed in the second channel region on the second active layer 135. In such an embodiment, the insulating pattern 160 may be interposed between the second active layer 135 and the second gate electrode 175, and may be spaced apart from the second source electrode 215 and the second drain electrode 235. The insulating pattern 160 may include a silicon compound or a metal oxide, for example. Alternatively, the insulating pattern 160 may have a multilayer structure having a plurality of insulating layers including materials which are different from each other.

The second gate electrode 175 may be disposed on the insulating pattern 160. In such an embodiment, the second gate electrode 175 may be disposed on the insulating pattern 160 under which the second channel region of the second active layer 135 is located. The second gate electrode 175 may include a metal, an alloy of a metal, a metal nitride, a conductive metal oxide or a transparent conductive material, for example. Such materials may be used alone or in combination with each other. Alternatively, the second gate electrode 175 may have a multilayer structure including a plurality of layers.

The second insulating interlayer 195 may be disposed in the first region 11 and the second region 12 on the first insulating interlayer 190, the second active layer 135, the insulating pattern 160, and the second gate electrode 175. In one exemplary embodiment, for example, the second insulating interlayer 195 may be disposed on the entire first insulating interlayer 190. The second insulating interlayer 195 may sufficiently cover the second active layer 135, the insulating pattern 160, and the second gate electrode 175 on the first insulating interlayer 190, and may have a substantially flat top surface without a step defined around the second active layer 135, the insulating pattern 160, and the second gate electrode 175. Alternatively, the second insulating interlayer 195 may cover the second active layer 135, the insulating pattern 160, and the second gate electrode 175 on the first insulating interlayer 190, and may be disposed with a substantially uniform thickness along profiles of the second active layer 135, the insulating pattern 160, and the second gate electrode 175. The second insulating interlayer 195 may include a silicon compound or a metal oxide, for example. Alternatively, the second insulating interlayer 195 may have a multilayer structure having a plurality of insulating layers including materials which are different from each other.

The first source electrode 210 and the first drain electrode 230 may be disposed in the first region 11 on the second insulating interlayer 195. The first source electrode 210 may be connected to the first source region of the first active layer 130 through a first contact hole defined through, e.g., formed by removing, first sections of the first gate insulating layer 150, the second gate insulating layer 155, the first insulating interlayer 190, and the second insulating interlayer 195. In such an embodiment, the first drain electrode 230 may be connected to the first drain region of the first active layer 130 through a second contact hole defined through, e.g., formed by removing, second sections of the first gate insulating layer 150, the second gate insulating layer 155, the first insulating interlayer 190, and the second insulating interlayer 195. Each of the first source electrode 210 and the first drain electrode 230 may include a metal, an alloy of a metal, a metal nitride, a conductive metal oxide or a transparent conductive material, for example. Such materials may be used alone or in combination with each other. In an alternative exemplary embodiment, each of the first source electrode 210 and the first drain electrode 230 may have a multilayer structure including a plurality of layers.

Accordingly, the driving transistor 250 including the first active layer 130, the first gate electrode 170, the first source electrode 210, and the first drain electrode 230 may be configured. In such an embodiment, the driving transistor 250 may function as a driving transistor including a silicon-based semiconductor. In such an embodiment, the driving transistor 250 may function as a transistor having a top gate structure. In one exemplary embodiment, for example, the driving transistor 250 may correspond to the first transistor TR1 shown in FIG. 3.

The second source electrode 215 and the second drain electrode 235 may be disposed in the second region 12 on the second insulating interlayer 195. The second source electrode 215 may be connected to the second source region of the second active layer 135 through a third contact hole defined through, e.g., formed by removing, third sections of the first gate insulating layer 150, the second gate insulating layer 155, the first insulating interlayer 190, and the second insulating interlayer 195. In such an embodiment, the second drain electrode 235 may be connected to the second drain region of the second active layer 135 through a fourth contact hole defined through, e.g., formed by removing, fourth sections of the first gate insulating layer 150, the second gate insulating layer 155, the first insulating interlayer 190, and the second insulating interlayer 195. Each of the second source electrode 215 and the second drain electrode 235 may include a metal, an alloy of a metal, a metal nitride, a conductive metal oxide or a transparent conductive material, for example. Such materials may be used alone or in combination with each other. In an alternative exemplary embodiment, each of the second source electrode 215 and the second drain electrode 235 may have a multilayer structure including a plurality of layers.

Accordingly, the switching transistor 255 including the second active layer 135, the second gate electrode 175, the second source electrode 215, and the second drain electrode 235 may be configured. In such an embodiment, the switching transistor 255 may function as a switching transistor including an oxide-based semiconductor. In such an embodiment, the switching transistor 255 may function as a transistor having a top gate structure. In one exemplary embodiment, for example, the switching transistor 255 may correspond to one of the second to seventh transistors TR2, TR3, TR4, TR5, TR6, and TR7 shown in FIG. 3. In an exemplary embodiment, the switching transistor 255 may correspond to the third transistor TR3 and/or the fourth transistor TR4, and the second, fifth, sixth, and seventh transistors TR2, TR5, TR6, and TR7 may function as a switching transistor including a silicon-based semiconductor.

In an exemplary embodiment, the OLED display device 100 may include two transistors (e.g., driving transistor 250 and switching transistor 255), but not being limited thereto. In one exemplary embodiment, for example, the OLED display device 100 may have a configuration including at least two transistors and at least one capacitor.

The protective insulating layer 400 may be disposed in the first region 11 and the second region 12 on the second insulating interlayer 195, the first source electrode 210, the first drain electrode 230, the second source electrode 215, and the second drain electrode 235. In such an embodiment, the protective insulating layer 400 may be disposed on the entire second insulating interlayer 195. In one exemplary embodiment, for example, the protective insulating layer 400 may sufficiently cover the first source electrode 210, the first drain electrode 230, the second source electrode 215 and the second drain electrode 235 on the second insulating interlayer 195, and may have a substantially flat top surface without a step defined around the first source electrode 210, the first drain electrode 230, the second source electrode 215, and the second drain electrode 235. Alternatively, the protective insulating layer 400 may cover the first source electrode 210, the first drain electrode 230, the second source electrode 215 and the second drain electrode 235 on the second insulating interlayer 195, and may be disposed with a substantially uniform thickness along profiles of the first source electrode 210, the first drain electrode 230, the second source electrode 215, and the second drain electrode 235. The protective insulating layer 400 may include a silicon compound or a metal oxide, for example. Alternatively, the protective insulating layer 400 may have a multilayer structure having a plurality of insulating layers including materials which are different from each other.

The planarization layer 270 may be disposed on the protective insulating layer 400. In such an embodiment, the planarization layer 270 may be disposed on the entire protective insulating layer 400. In one exemplary embodiment, for example, the planarization layer 270 may have a relatively thick thickness to sufficiently cover the protective insulating layer 400, and in such an embodiment, the planarization layer 270 may have a substantially flat top surface. In order to implement such a flat top surface of the planarization layer 270, a planarization process may be additionally performed on the planarization layer 270. The planarization layer 270 may include an organic material or an inorganic material. In an exemplary embodiment, the planarization layer 270 may include the organic material.

The connection pattern 370 may be disposed on the planarization layer 270. A high power supply voltage (e.g., high power supply voltage ELVDD shown in FIG. 3) may be applied to the connection pattern 370. In such an embodiment, the connection pattern 370 may be connected to the second terminal of the sixth transistor TR6 shown in FIG. 3. In one exemplary embodiment, for example, the first drain electrode 230 of the driving transistor 250 may transmit the high power supply voltage ELVDD to the connection pattern 370 (e.g., second terminal of sixth transistor TR6 shown in FIG. 3), and the high power supply voltage ELVDD transmitted to the connection pattern 370 may be applied to the lower electrode 290. The connection pattern 370 may include a metal, an alloy of a metal, a metal nitride, a conductive metal oxide or a transparent conductive material, for example. Such materials may be used alone or in combination with each other. Alternatively, the connection pattern 370 may have a multilayer structure including a plurality of layers.

The light absorbing layer 350 may be disposed on the planarization layer 270 and a part of the connection pattern 370. The light absorbing layer 350 may cover both sides of the connection pattern 370 with a contact hole for exposing a part of a top surface of the connection pattern 370. In an exemplary embodiment, the light absorbing layer 350 may effectively prevent external light penetrating into the OLED display device 100 from being incident on the second active layer 135, and may effectively prevent a part of light, which is emitted from the light emitting layer 330, from being reflected from the upper electrode 340 to be incident on the second active layer 135. The light absorbing layer 350 may include an organic material such as photoresist, a polyacryl-based resin, a polyimide-based resin, a polyamide-based resin, a siloxane-based resin, an acryl-based resin, or an epoxy-based resin. In such an embodiment, the light absorbing layer 350 may be substantially opaque. In one exemplary embodiment, for example, the light absorbing layer 350 may further include a light shielding material for absorbing the external light. The light shielding material may include carbon black, titanium nitride oxide, titanium black, phenylene black, aniline black, cyanine black, nigrosine acid black or a black resin, for example.

In a conventional diode display device, external light penetrating into thereinto and/or a part of light emitted from a light emitting layer thereof may penetrate into a portion where a driving transistor and a switching transistor are disposed, and the light (e.g., external light and light emitted from light emitting layer) may be reflected from an interface of insulating layers and metal electrodes to be incident on a bottom surface of a second active layer. When the light is incident on the second active layer, the second active layer including a metal-oxide-based semiconductor may be rapidly deteriorated, and characteristics of the switching transistor including the metal-oxide-based semiconductor may be changed, such that the conventional OLED display device may be defective.

In an exemplary embodiment of the invention, the OLED display device 100 includes the light absorbing layer 350 for absorbing light, such that the external light penetrating into the OLED display device 100 and the part of the light emitted from the light emitting layer 330 may be absorbed. In such an embodiment, the light absorbing layer 350 may absorb about 90% of the light incident thereon. Accordingly, in such an embodiment, the OLED display device 100 may protect the second active layer 135 including the metal oxide-based semiconductor, and the characteristics of the switching transistor 255 including the second active layer 135 may not be changed.

In an exemplary embodiment, the organic insulating layer 275 may be disposed on the light absorbing layer 350. The organic insulating layer 275 may have a contact hole for exposing a part of the top surface of the connection pattern 370, and the contact hole of the organic insulating layer 275 may overlap the contact hole of the light absorbing layer 350. In one exemplary embodiment, for example, the organic insulating layer 275 may have a relatively thick thickness to sufficiently cover the light absorbing layer 350, and in such an embodiment, the organic insulating layer 275 may have a substantially flat top surface. In an exemplary embodiment, the planarization process may be additionally performed on the organic insulating layer 275 to implement such a flat top surface of the organic insulating layer 275. The organic insulating layer 275 may include an organic material or an inorganic material. In an exemplary embodiment, the organic insulating layer 275 may include the organic material.

The lower electrode 290 may be disposed on the organic insulating layer 275. The lower electrode 290 may be connected to the connection pattern 370 through the contact hole of the organic insulating layer 275 and the contact hole of the light absorbing layer 350. The lower electrode 290 may include a metal, an alloy of a metal, a metal nitride, conductive metal oxide or a transparent conductive material, for example. Such materials may be used alone or in combination with each other. Alternatively, the lower electrode 290 may have a multilayer structure including a plurality of layers.

The pixel defining layer 310 may be disposed on a part of the lower electrode 290 and the organic insulating layer 275. The pixel defining layer 310 may cover both sides of the lower electrode 290, and may expose a part of a top surface of the lower electrode 290. The pixel defining layer 310 may include or be formed of an organic material or an inorganic material. In an exemplary embodiment, the pixel defining layer 310 may include the organic material.

The light emitting layer 330 may be disposed on the lower electrode 290 exposed by the pixel defining layer 310. The light emitting layer 330 may include or be formed using at least one of light emitting materials for emitting different color lights (i.e., red light, green light, blue light, etc.) corresponding to sub-pixels. Alternatively, the light emitting layer 330 may be formed by laminating a plurality of light emitting materials for emitting the different color lights such as red light, green light, or blue light to emit white light as a whole. In such an embodiment, a color filter may be disposed on the light emitting layer 330 (e.g., to overlap light emitting layer 330 on top surface of thin film encapsulation structure 450). The color filter may include at least one of a red color filter, a green color filter, and a blue color filter. Alternatively, the color filter may include a yellow color filter, a cyan color filter or a magenta color filter. The color filter may include a photosensitive resin or a color photoresist, for example.

The upper electrode 340 may be disposed on the pixel defining layer 310 and the light emitting layer 330. The upper electrode 340 may cover the light emitting layer 330 and the pixel defining layer 310, and may be disposed entirely on the light emitting layer 330 and the pixel defining layer 310. In an exemplary embodiments a low power supply voltage (e.g., low power supply voltage ELVSS shown in FIG. 3) may be applied to the upper electrode 340. The upper electrode 340 may include a metal, an alloy of a metal, a metal nitride, a conductive metal oxide, a transparent conductive material, for example. Such materials may be used alone or in combination with each other. Alternatively, the upper electrode 340 may have a multilayer structure including a plurality of layers.

In such an embodiment, the sub-pixel structure 200 including the lower electrode 290, the light emitting layer 330, and the upper electrode 340 may be configured as described above.

The first thin film encapsulation layer 451 may be disposed in the light emitting region 30 on the upper electrode 340. The first thin film encapsulation layer 451 may cover the upper electrode 340 in the light emitting region 30, and may be disposed with a substantially uniform thickness along a profile of the upper electrode 340. The first thin film encapsulation layer 451 may effectively prevent the sub-pixel structure 200 from being deteriorated due to penetration of moisture, oxygen, etc. In such an embodiment, the first thin film encapsulation layer 451 may function to protect the sub-pixel structure 200 from an external impact. The first thin film encapsulation layer 451 may include a flexible inorganic material.

The second thin film encapsulation layer 452 may be disposed in the light emitting region 30 on the first thin film encapsulation layer 451. The second thin film encapsulation layer 452 may improve flatness of the OLED display device 100, and may protect the sub-pixel structure 200. The second thin film encapsulation layer 452 may include a flexible organic material.

The third thin film encapsulation layer 453 may be disposed in the light emitting region 30 on the second thin film encapsulation layer 452. The third thin film encapsulation layer 453 may cover the second thin film encapsulation layer 452 in the light emitting region 30, and may be disposed with a substantially uniform thickness along a profile of the second thin film encapsulation layer 452. The third thin film encapsulation layer 453 may effectively prevent the sub-pixel structure 200 from being deteriorated due to the penetration of moisture, oxygen, etc., together with the first thin film encapsulation layer 451. In such an embodiment, the third thin film encapsulation layer 453 may function to protect the sub-pixel structure 200 from an external impact together with the first thin film encapsulation layer 451 and the second thin film encapsulation layer 452. The third thin film encapsulation layer 453 may include a flexible inorganic material. Alternatively, an encapsulation substrate may be disposed on the upper electrode 340 in place of the thin film encapsulation structure 450. The encapsulation substrate may include a quartz substrate, a synthetic quartz substrate, a calcium fluoride substrate, a fluorine-doped quartz substrate, a soda lime glass substrate or a non-alkali glass substrates, for example.

Accordingly, the thin film encapsulation structure 450 including the first thin film encapsulation layer 451, the second thin film encapsulation layer 452, and the third thin film encapsulation layer 453 may be configured as described above. Alternatively, the thin film encapsulation structure 450 may have a five-layers structure formed by laminating first to fifth thin film encapsulation layers or a seven-layers structure formed by laminating first to seventh thin film encapsulation layers.

In an exemplary embodiment of the invention, the OLED display device 100 includes the light absorbing layer 350, such that the OLED display device 100 may block the light incident on the second active layer 135. Accordingly, the OLED display device 100 may effectively protect the second active layer 135 including the oxide-based semiconductor, and may maintain the characteristics of the switching transistor 255.

FIGS. 5 to 16 are sectional views showing a method of manufacturing an organic light emitting diode display device according to an exemplary embodiment of the invention.

Figure 5:
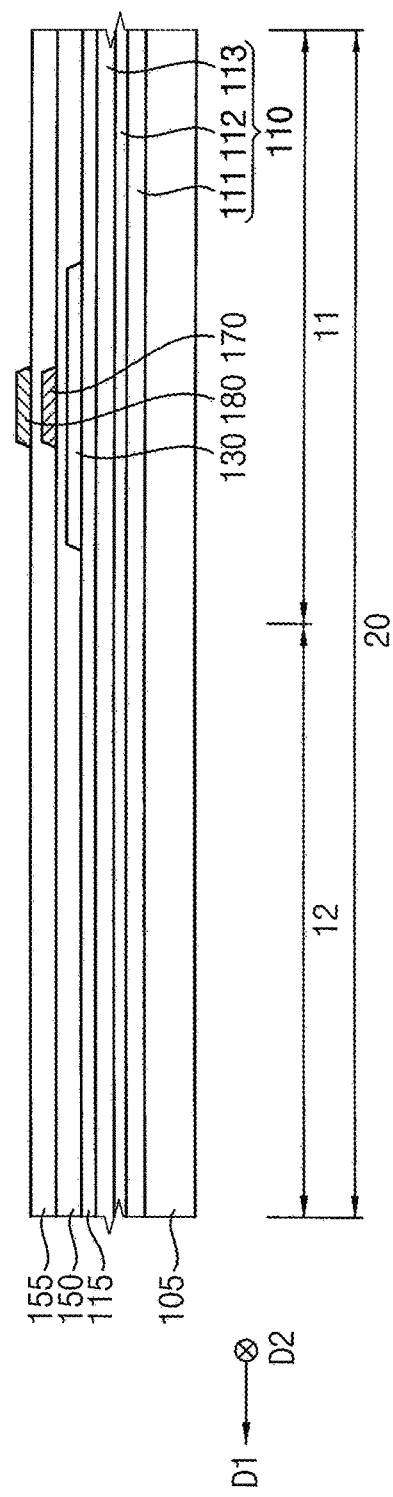
FIGS. 5 to 16 are sectional views showing a method of manufacturing an organic light emitting diode display device according to an exemplary embodiment of the invention.

Referring to FIG. 5, in an exemplary embodiment of the method of manufacturing the organic light emitting diode display device, a rigid glass substrate 105 may be prepared. A first organic layer 111 may be provided or formed on the glass substrate 105. The first organic layer 111 may be formed using a flexible organic material. In an exemplary embodiment, the first organic layer 111 may include polyimide. In one exemplary embodiment, for example, the first organic layer 111 may include a random copolymer or a block copolymer. In such an embodiment, the first organic layer 111 may have a high transparency, a low coefficient of thermal expansion, and a high glass transition temperature. In an exemplary embodiment, the first organic layer 111 includes an imide group, such that the first organic layer 111 may have high heat resistance, chemical resistance, abrasion resistance, and electrical characteristics.

A barrier layer 112 may be provided or formed on the entire first organic layer 111. The barrier layer 112 may block moisture penetrating through the first organic layer 111. The barrier layer 112 may be formed using a flexible inorganic material.

A second organic layer 113 may be provided or formed on the entire barrier layer 112. The second organic layer 113 may be formed using a flexible organic material. In the exemplary embodiments, the second organic layer 113 may include polyimide. In one exemplary embodiment, for example, the second organic layer 113 may include a random copolymer or a block copolymer.

Accordingly, the substrate 110 including the first organic layer 111, the barrier layer 112, and the second organic layer 113 may be formed. In the exemplary embodiments, the substrate 110 may have the first region 11 and the second region 12, where the first region 11 may be adjacent to the second region 12. In one exemplary embodiment, for example, the first region 11 may be a region where the driving transistor is formed, and the second region 12 may be a region where the switching transistor is formed.

In an exemplary embodiment, the substrate 110 may have three layers, but not being limited thereto. In one exemplary embodiment, for example, the substrate 110 may include a single layer or at least two layers.

In such an embodiment, since the substrate 110 is thin and flexible, the substrate 110 may be provided or formed on the rigid glass substrate 105 to support formation of upper structures (e.g., driving transistor, switching transistor, sub-pixel structure, etc.). In one exemplary embodiment, for example, after providing the upper structure on the substrate 110, the glass substrate 105 may be removed. In such an embodiment, due to flexible physical properties of the first organic layer 111, the barrier layer 112 and the second organic layer 113, the upper structure may not be effectively formed directly on the first organic layer 111, the barrier layer 112 and the second organic layer 113. Accordingly, in an exemplary embodiment, the upper structure is formed using the glass substrate 105, and then the glass substrate 105 is removed, such that the first organic layer 111, the barrier layer 112 and the second organic layer 113 may be used as the substrate 110.

In an alternative exemplary embodiment, the substrate 110 may include a transparent or opaque material. In one exemplary embodiment, the substrate 110 may include a quartz substrate, a synthetic quartz substrate, a calcium fluoride substrate, a fluorine-doped quartz substrate, a soda lime glass substrate or a non-alkali glass substrates, for example. In such an embodiment, the glass substrate 105 may not be used.

A buffer layer 115 may be provided or formed in the first region 11 and the second region 12 on the substrate 110. In one exemplary embodiment, for example, the buffer layer 115 may be provided or formed on the entire substrate 110. The buffer layer 115 may effectively prevent metal atoms or impurities from being diffused from the substrate 110, and may control the heat transfer rate during the crystallization process for forming the first active layer 130 to obtain the substantially uniform first active layer 130. In such an embodiment, the buffer layer 115 may serve to improve the flatness of the surface of the substrate 110 when the surface of the substrate 110 is not uniform. Depending on the type of the substrate 110, at least two buffer layers 115 may be provided on the substrate 110, or the buffer layer 115 may not be provided on the substrate 110. The buffer layer 115 may be formed using an inorganic material.

A first active layer 130 may be provided or formed in the first region 11 on the buffer layer 115. In one exemplary embodiment, the first active layer 130 may include a metal oxide semiconductor, an amorphous silicon, a polysilicon or an organic semiconductor, for example. In an exemplary embodiment, the first active layer 130 may be formed using a silicon-based semiconductor, e.g., the amorphous silicon or the polysilicon. In an exemplary embodiment, the first active layer 130 may have a first source region, a first drain region, and a first channel region located between the first source region and the first drain region.

A first gate insulating layer 150 may be provided or formed in the first region 11 and the second region 12 on the buffer layer 115 and the first active layer 130. In one exemplary embodiment, for example, the first gate insulating layer 150 may be provided or formed on the entire buffer layer 115. The first gate insulating layer 150 may sufficiently cover the first active layer 130 on the buffer layer 115, and may have a substantially flat top surface without a step defined around the first active layer 130. Alternatively, the first gate insulating layer 150 may cover the first active layer 130 on the buffer layer 115, and may be formed with a substantially uniform thickness along the profile of the first active layer 130. The first gate insulating layer 150 may be formed using a silicon compound, metal oxide, etc. In one exemplary embodiment, for example, the first gate insulating layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$ or $TiO_x$. Alternatively, the first gate insulating layer 150 may have a multilayer structure having a plurality of insulating layers including materials which are different from each other.

A first gate electrode 170 may be provided or formed in the first region 11 on the gate insulating layer 150. In such an embodiment, the first gate electrode 170 may be provided or formed on a portion of the gate insulating layer 150 under which the first active layer 130 is located (e.g., first channel region). The first gate electrode 170 may be formed using a metal, an alloy of a metal, metal nitride, a conductive metal oxide or a transparent conductive material, for example. In one exemplary embodiment, the first gate electrode 170 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$ or IZO, for example. Such materials may be used alone or in combination with each other. Alternatively, the first gate electrode 170 may have a multilayer structure including a plurality of layers.

A second gate insulating layer 155 may be provided or formed in the first region 11 and the second region 12 on the first gate insulating layer 150 and the first gate electrode 170. In one exemplary embodiment, for example, the second gate insulating layer 155 may be provided or formed on the entire first gate insulating layer 150. The second gate insulating layer 155 may sufficiently cover the first gate electrode 170 on the first gate insulating layer 150, and may have a substantially flat top surface without a step defined around the first gate electrode 170. Alternatively, the second gate insulating layer 155 may cover the first gate electrode 170 on the first gate insulating layer 150, and may be formed with a substantially uniform thickness along the profile of the first gate electrode 170. The second gate insulating layer 155 may be formed using a silicon compound or a metal oxide, for example. Alternatively, the second gate insulating layer 155 may have a multilayer structure having a plurality of insulating layers including materials which are different from each other.

A gate electrode pattern 180 may be provided or formed in the first region 11 on the second gate insulating layer 155. In such an embodiment, the gate electrode pattern 180 may be provided or formed on a portion of the second gate insulating layer 155 under which the first gate electrode 170 is located. The gate electrode pattern 180 may be formed using a metal, an alloy of a metal, metal nitride, a conductive metal oxide or a transparent conductive material, for example. Alternatively, the gate electrode pattern 180 may have a multilayer structure including a plurality of layers.

Figure 6:
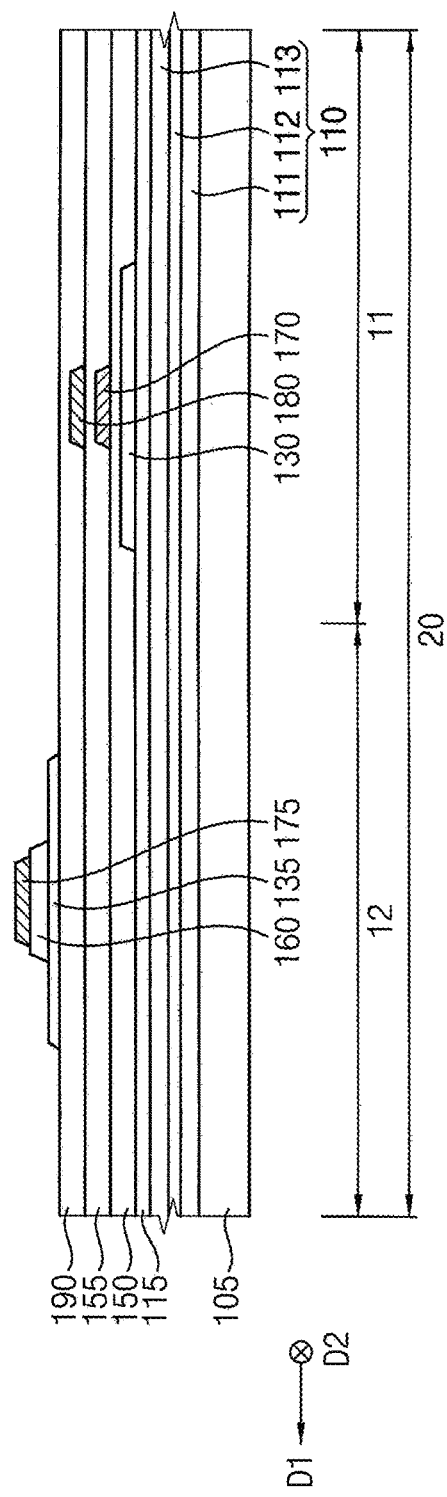

Referring to FIG. 6, a first insulating interlayer 190 may be provided or formed in the first region 11 and the second region 12 on the second gate insulating layer 155 and the gate electrode pattern 180. In one exemplary embodiment, for example, the first insulating interlayer 190 may be provided or formed on the entire second gate insulating layer 155. The first insulating interlayer 190 may sufficiently cover the gate electrode pattern 180 on the second gate insulating layer 155, and may have a substantially flat top surface without a step defined around the gate electrode pattern 180. Alternatively, the first insulating interlayer 190 may cover the gate electrode pattern 180 on the second gate insulating layer 155, and may be formed with a substantially uniform thickness along the profile of the gate electrode pattern 180. The first insulating interlayer 190 may be formed using a silicon compound or a metal oxide, for example. Alternatively, the first insulating interlayer 190 may have a multilayer structure having a plurality of insulating layers including materials which are different from each other.

A second active layer 135 may be provided or formed in the second region 12 on the first insulating interlayer 190. The second active layer 135 may be formed using a metal oxide semiconductor. In such an embodiment, the second active layer 135 may be a semiconductor oxide layer including a binary compound, a ternary compound, a quaternary compound, or the like containing In, Zn, Ga, Sn, Ti, Al, Hf, Zr, Mg, etc. In one exemplary embodiment, the second active layer 135 may include $ZnO_x$, $GaO_x$, $TiO_x$, $SnO_x$, $InO_x$, IGO, IZO, ITO, GZO, ZMO, ZTO, $ZnZr_xO_y$, IGZO, IZTO, IGHO, TAZO or IGTO, for example. In an exemplary embodiment, the second active layer 135 may have a second source region, a second drain region, and a second channel region located between the second source region and the second drain region.

An insulating pattern 160 may be provide or formed in the second channel region on the second active layer 135. The insulating pattern 160 may be formed using a silicon compound, metal oxide, etc. Alternatively, the insulating pattern 160 may have a multilayer structure having a plurality of insulating layers including materials which are different from each other.

A second gate electrode 175 may be provided or formed on the insulating pattern 160. In such an embodiment, the second gate electrode 175 may be provided or formed on the insulating pattern 160 under which the second channel region of the second active layer 135 is located. The second gate electrode 175 may be formed using a metal, an alloy of a metal, metal nitride, a conductive metal oxide or a transparent conductive material, for example. Such materials may be used alone or in combination with each other. Alternatively, the second gate electrode 175 may have a multilayer structure including a plurality of layers.

Figure 7:
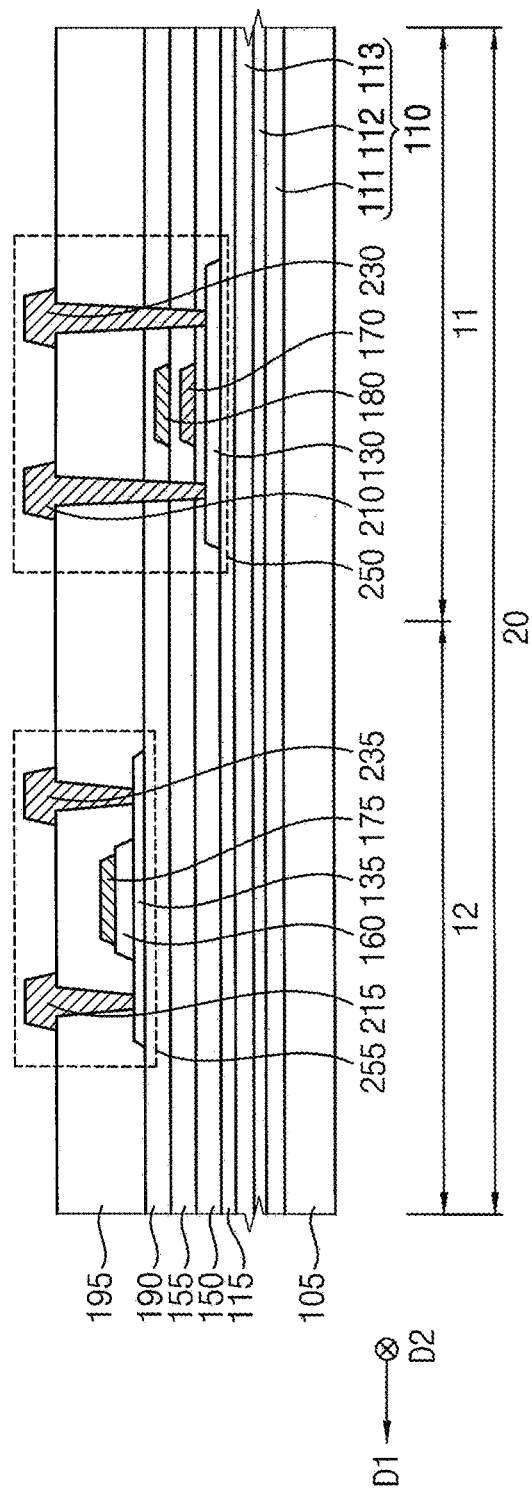

Referring to FIG. 7, a second insulating interlayer 195 may be provided or formed in the first region 11 and the second region 12 on the first insulating interlayer 190, the second active layer 135, the insulating pattern 160, and the second gate electrode 175. In one exemplary embodiment, for example, the second insulating interlayer 195 may be provided or formed on the entire first insulating interlayer 190. The second insulating interlayer 195 may sufficiently cover the second active layer 135, the insulating pattern 160, and the second gate electrode 175 on the first insulating interlayer 190, and may have a substantially flat top surface without forming a step around the second active layer 135, the insulating pattern 160, and the second gate electrode 175. Alternatively, the second insulating interlayer 195 may cover the second active layer 135, the insulating pattern 160, and the second gate electrode 175 on the first insulating interlayer 190, and may be formed with a substantially uniform thickness along the profiles of the second active layer 135, the insulating pattern 160, and the second gate electrode 175. The second insulating interlayer 195 may be formed using a silicon compound or a metal oxide, for example. Alternatively, the second insulating interlayer 195 may have a multilayer structure having a plurality of insulating layers including materials which are different from each other.

A first source electrode 210 and a first drain electrode 230 may be provided or formed in the first region 11 on the second insulating interlayer 195. The first source electrode 210 may be connected to the first source region of the first active layer 130 through the first contact hole formed by removing the first sections of the first gate insulating layer 150, the second gate insulating layer 155, the first insulating interlayer 190, and the second insulating interlayer 195. In such an embodiment, the first drain electrode 230 may be connected to the first drain region of the first active layer 130 through the second contact hole formed by removing the second sections of the first gate insulating layer 150, the second gate insulating layer 155, the first insulating interlayer 190, and the second insulating interlayer 195. Each of the first source electrode 210 and the first drain electrode 230 may be formed using a metal, an alloy of a metal, metal nitride, a conductive metal oxide or a transparent conductive material, for example. Such materials may be used alone or in combination with each other. In an alternative exemplary embodiment, each of the first source electrode 210 and the first drain electrode 230 may have a multilayer structure including a plurality of layers.

Accordingly, a driving transistor 250 including the first active layer 130, the first gate electrode 170, the first source electrode 210, and the first drain electrode 230 may be formed as described above. In such an embodiment, the driving transistor 250 may function as a driving transistor including a silicon-based semiconductor. In such an embodiment, the driving transistor 250 may function as a transistor having a top gate structure.

A second source electrode 215 and a second drain electrode 235 may be formed in the second region 12 on the second insulating interlayer 195. The second source electrode 215 may be connected to the second source region of the second active layer 135 through the third contact hole formed by removing the third sections of the first gate insulating layer 150, the second gate insulating layer 155, the first insulating interlayer 190, and the second insulating interlayer 195. In such an embodiment, the second drain electrode 235 may be connected to the second drain region of the second active layer 135 through the fourth contact hole formed by removing the fourth sections of the first gate insulating layer 150, the second gate insulating layer 155, the first insulating interlayer 190, and the second insulating interlayer 195. Each of the second source electrode 215 and the second drain electrode 235 may be formed using a metal, an alloy of a metal, a metal nitride, a conductive metal oxide or a transparent conductive material, for example. Such materials may be used alone or in combination with each other. In one exemplary embodiment, for example, the first source electrode 210, the first drain electrode 230, the second source electrode 215, and the second drain electrode 235 may be simultaneously formed using a same material. In an alternative exemplary embodiment, each of the second source electrode 215 and the second drain electrode 235 may have a multilayer structure including a plurality of layers.

Accordingly, a switching transistor 255 including the second active layer 135, the second gate electrode 175, the second source electrode 215, and the second drain electrode 235 may be formed as described above. In such an embodiment, the switching transistor 255 may function as a switching transistor including an oxide-based semiconductor. In such an embodiment, the switching transistor 255 may function as a transistor having a top gate structure.

Figure 8:
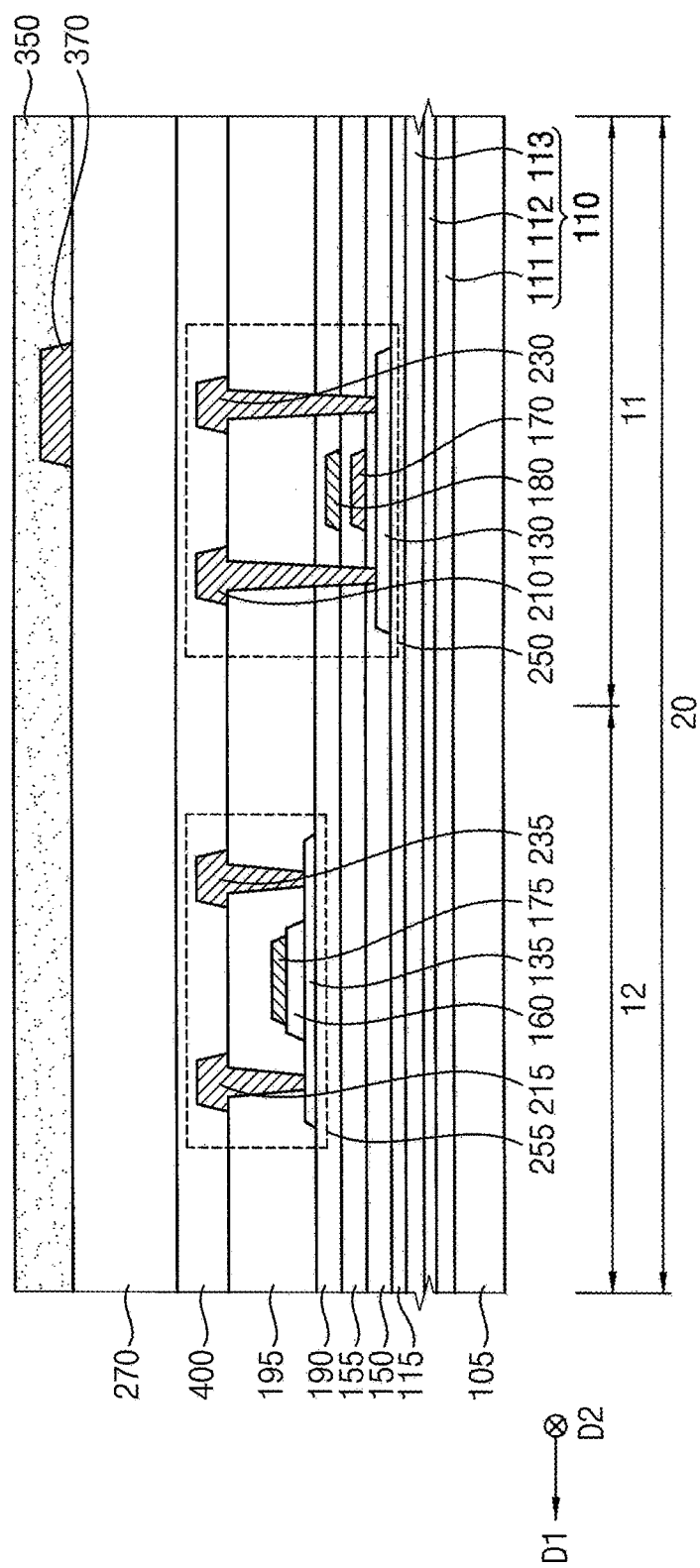

Referring to FIG. 8, a protective insulating layer 400 may be provided or formed in the first region 11 and the second region 12 on the second insulating interlayer 195, the first source electrode 210, the first drain electrode 230, the second source electrode 215, and the second drain electrode 235. In such an embodiment, the protective insulating layer 400 may be provided or formed on the entire second insulating interlayer 195. In one exemplary embodiment, for example, the protective insulating layer 400 may sufficiently cover the first source electrode 210, the first drain electrode 230, the second source electrode 215, and the second drain electrode 235 on the second insulating interlayer 195, and may have a substantially flat top surface without forming a step around the first source electrode 210, the first drain electrode 230, the second source electrode 215, and the second drain electrode 235. Alternatively, the protective insulating layer 400 may cover the first source electrode 210, the first drain electrode 230, the second source electrode 215, and the second drain electrode 235 on the second insulating interlayer 195, and may be formed as a substantially uniform thickness along the profiles of the first source electrode 210, the first drain electrode 230, the second source electrode 215, and the second drain electrode 235. The protective insulating layer 400 may be formed using a silicon compound or a metal oxide, for example. Alternatively, the protective insulating layer 400 may have a multilayer structure having a plurality of insulating layers including materials which are different from each other.

A planarization layer 270 may be provided or formed on the protective insulating layer 400. In such an embodiment, the planarization layer 270 may be provided or formed on the entire protective insulating layer 400. In one exemplary embodiment, for example, the planarization layer 270 may have a relatively thick thickness to sufficiently cover the protective insulating layer 400, and in such an embodiment, the planarization layer 270 may have a substantially flat top surface. In an exemplary embodiment, the planarization process may be additionally performed on the planarization layer 270 to implement such a flat top surface of the planarization layer 270. The planarization layer 270 may be formed using an organic material.

A connection pattern 370 may be provided or formed on the planarization layer 270. The connection pattern 370 may be formed using a metal, an alloy of a metal, a metal nitride, a conductive metal oxide or a transparent conductive material, for example. Such materials may be used alone or in combination with each other. Alternatively, the connection pattern 370 may have a multilayer structure including a plurality of layers.

A light absorbing layer 350 may be provided or formed on the planarization layer 270 and the connection pattern 370. In such an embodiment, the light absorbing layer 350 may be provided or formed on the entire planarization layer 270. In one exemplary embodiment, for example, the light absorbing layer 350 may have a relatively thick thickness to sufficiently cover the connection pattern 370. The light absorbing layer 350 may be formed using an organic material such as photoresist, a polyacryl-based resin, a polyimide-based resin, a polyamide-based resin, a siloxane-based resin, an acryl-based resin or an epoxy-based resin. In such an embodiment, the light absorbing layer 350 may be substantially opaque. In one exemplary embodiment, for example, the light absorbing layer 350 may further include a light shielding material for absorbing the external light. The light shielding material may include carbon black, titanium nitride oxide, titanium black, phenylene black, aniline black, cyanine black, nigrosine acid black or a black resin, for example.

Figure 9:
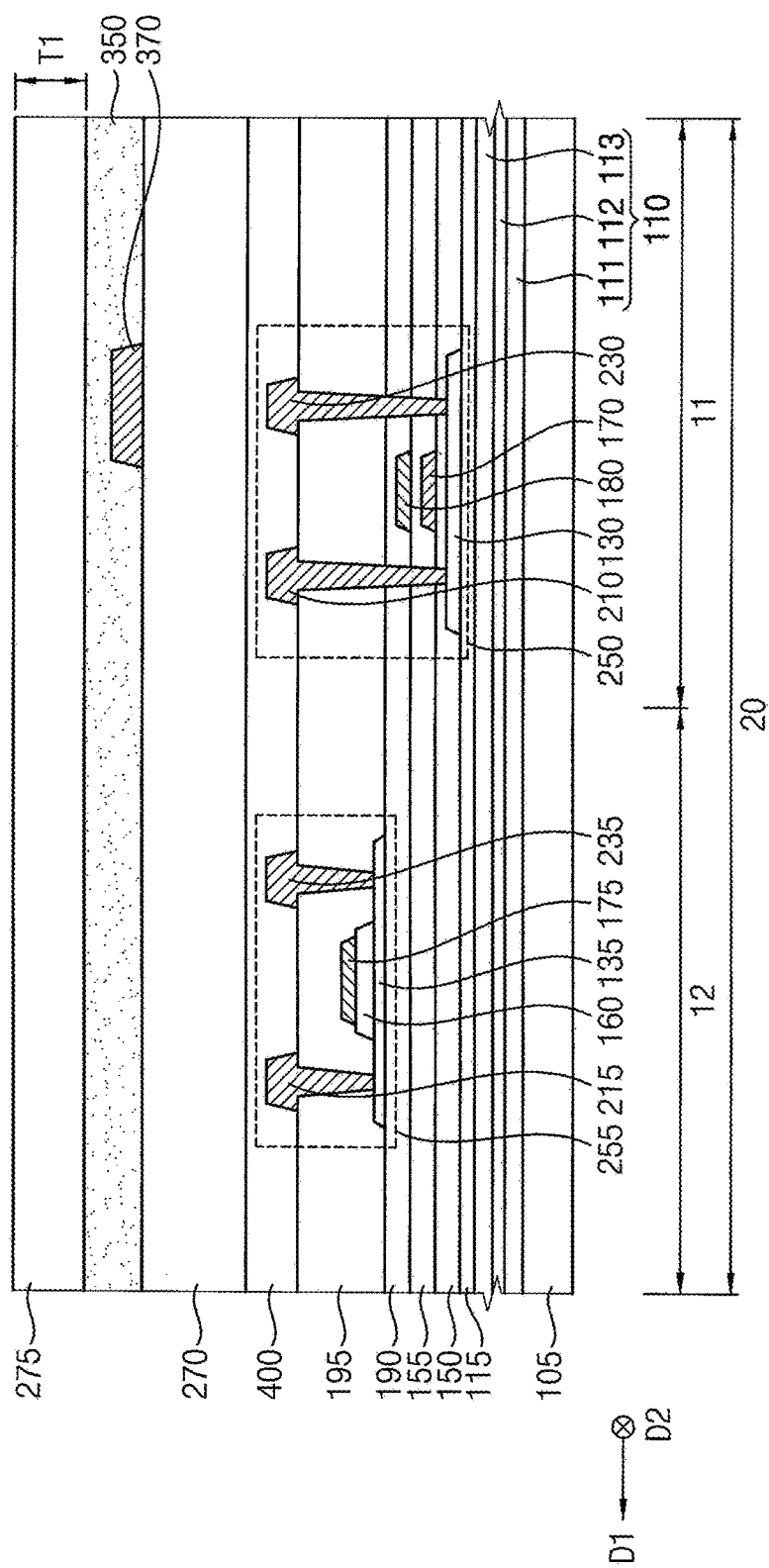

Referring to FIG. 9, an organic insulating layer 275 may be provided or formed on the light absorbing layer 350. In one exemplary embodiment, for example, the organic insulating layer 275 may have a relatively thick thickness (e.g., first thickness T1) to sufficiently cover the light absorbing layer 350, and in this case, the organic insulating layer 275 may have a substantially flat top surface. In an exemplary embodiment, the planarization process may be additionally performed on the organic insulating layer 275 to implement such a flat top surface of the organic insulating layer 275. The organic insulating layer 275 may be formed using an organic material.

Figure 10:
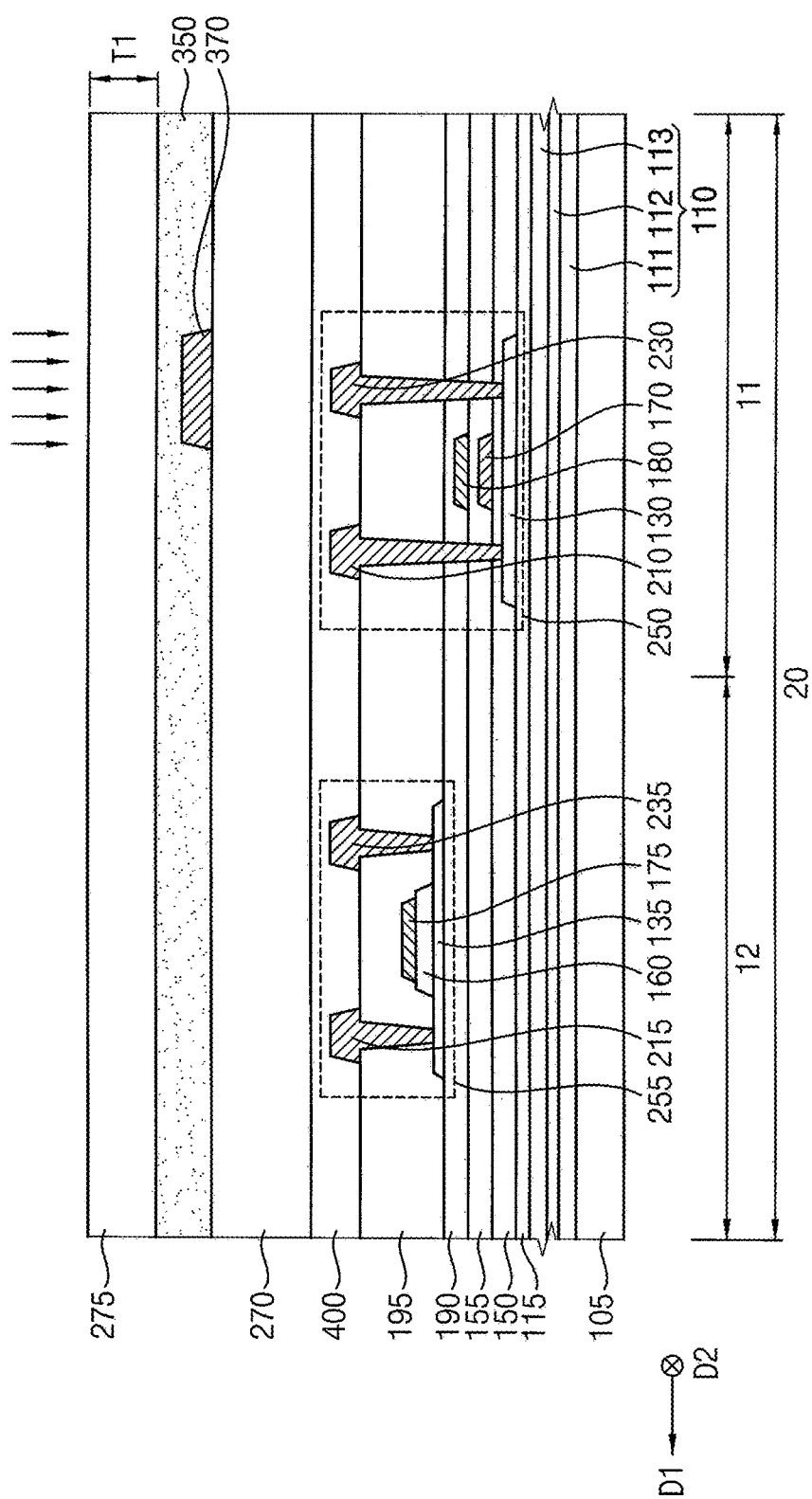
Figure 11:
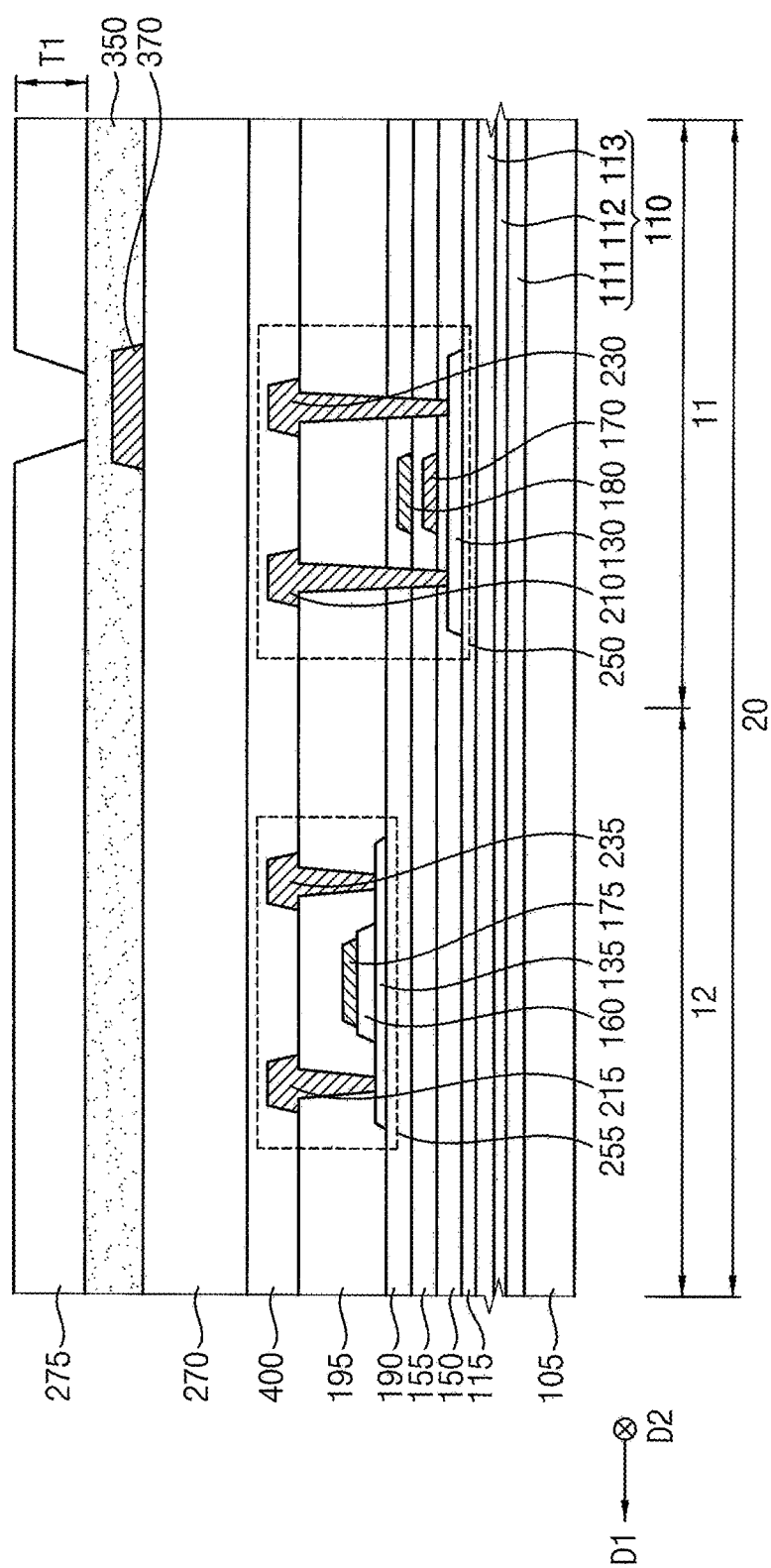

Referring to FIGS. 10 and 11, a light exposure process using a mask may be performed. In one exemplary embodiment, for example, light may be irradiated to a first portion of the organic insulating layer 275 through an opening of the mask to form a first contact hole for exposing a part of a top surface of the light absorbing layer 350, such that the first contact hole may be formed in the organic insulating layer 275. The first portion of the light absorbing layer 350 may overlap a portion where the connection pattern 370 is located.

Figure 12:
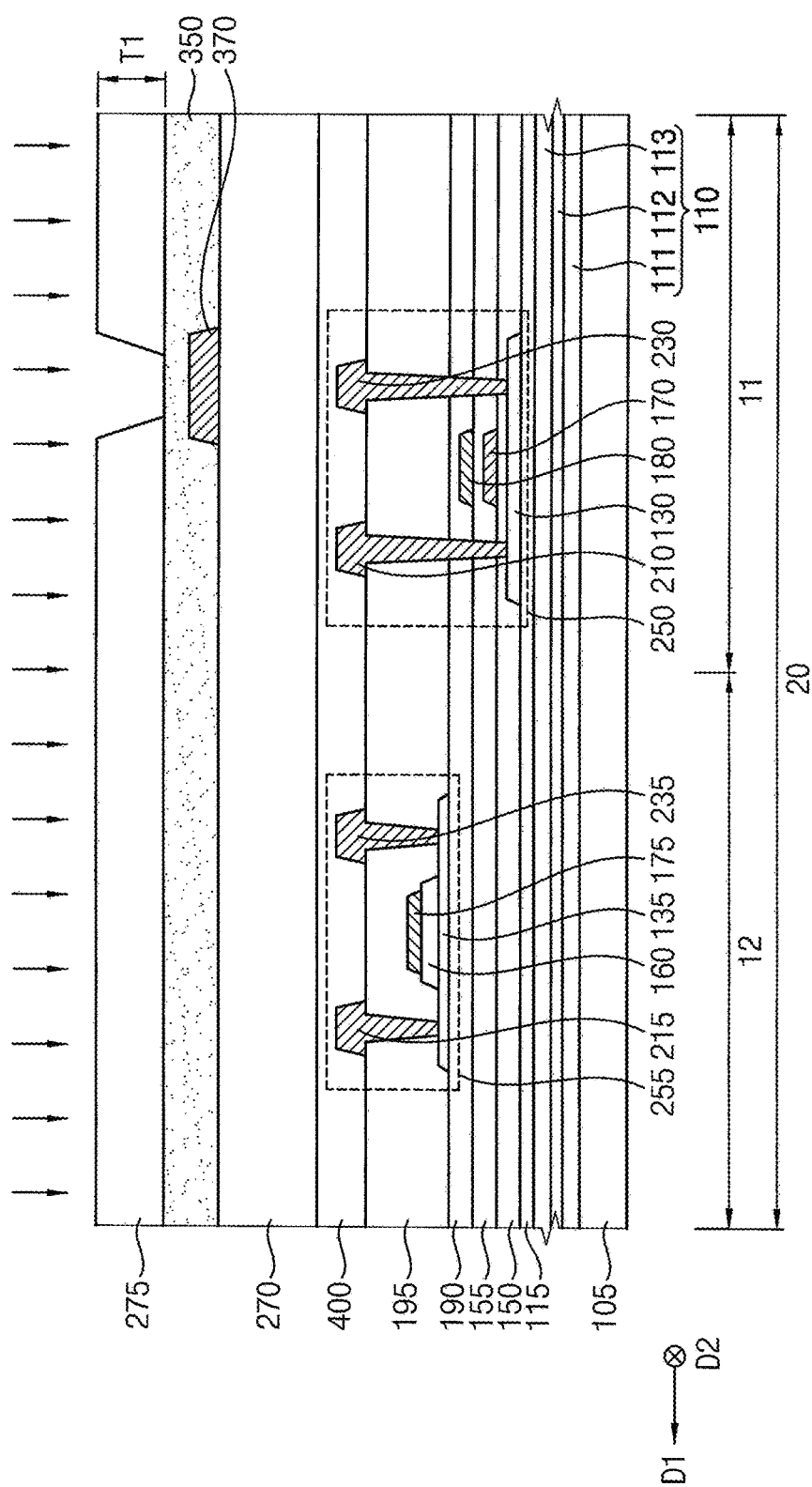
Figure 13:
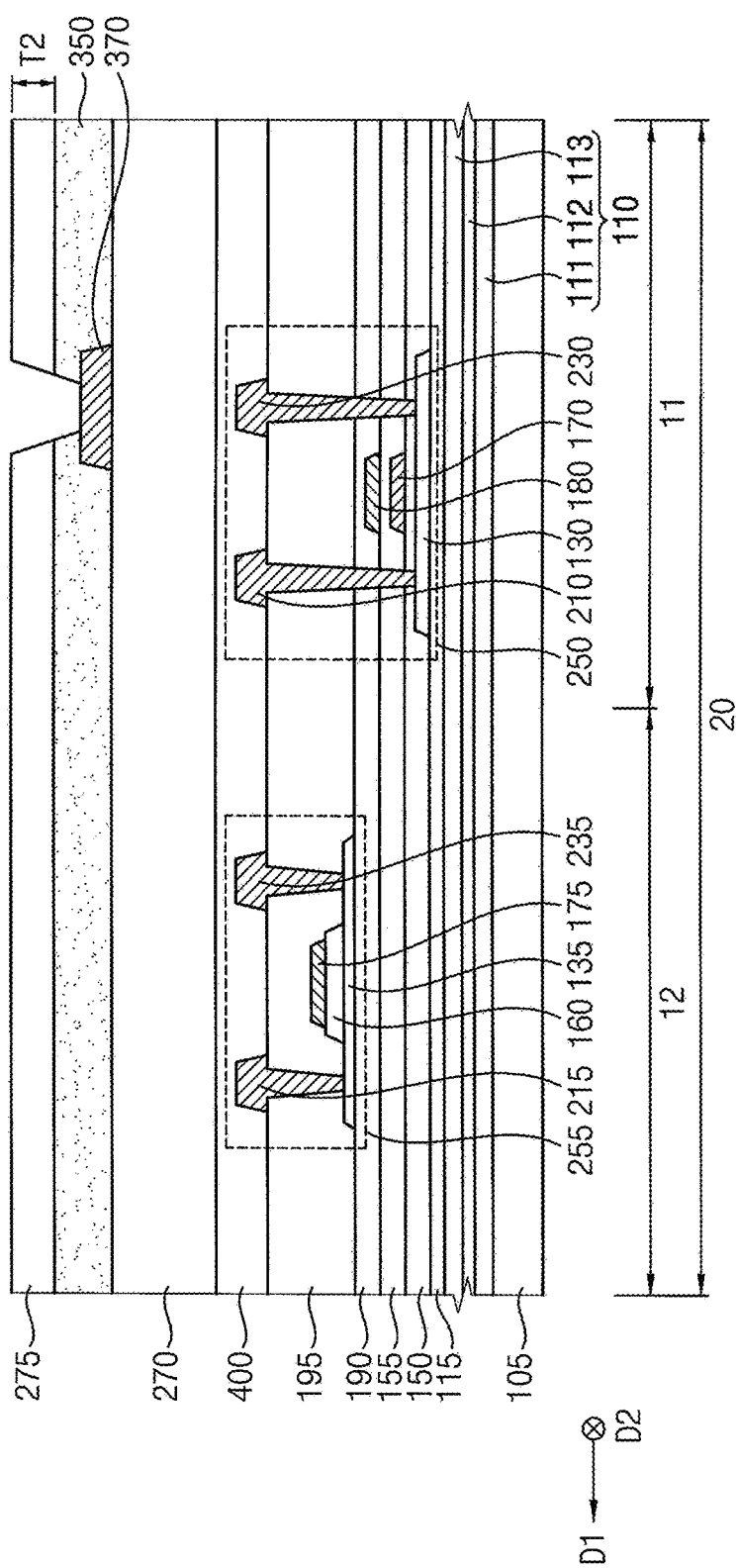

Referring to FIGS. 12 and 13, a dry etching process may be performed on the glass substrate 105. In one exemplary embodiment, for example, a second portion of the light absorbing layer 350 may be dry-etched through the first contact hole to form a second contact hole for exposing the part of the top surface of the connection pattern 370. In an exemplary embodiment, the second portion of the light absorbing layer 350 and the first portion of the organic insulating layer 275 may overlap each other, and the first contact hole and the second contact hole may overlap each other. In such an embodiment, the thickness of the organic insulating layer 275 may be reduced from a first thickness T1 to a second thickness T2 during the dry etching process.

In a method of manufacturing the organic light emitting diode display device, if the organic insulating layer 275 is not provided or formed on the light absorbing layer 350, the second contact hole may not be formed in the light absorbing layer 350. When the light exposure process using the mask is performed to form the second contact hole, the light absorbing layer 350 including the light shielding material may absorb the light, and the second contact hole is not formed in the light absorbing layer 350. Therefore, In an exemplary embodiment, after forming the organic insulating layer 275 having the first contact hole on the light absorbing layer 350, the dry etching process is performed, so that the second contact hole may be formed in the light absorbing layer 350.

Figure 14:
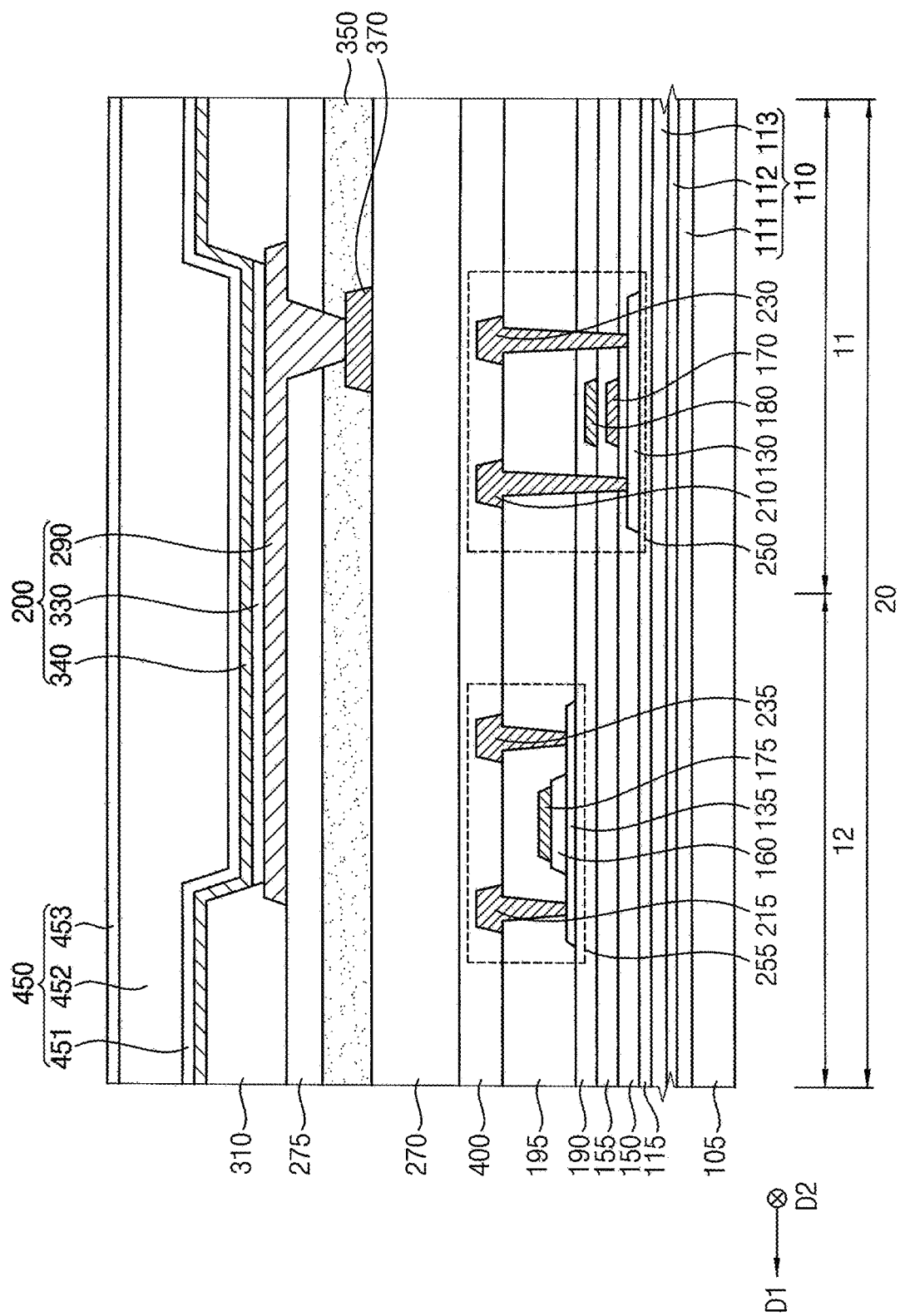

Referring to FIG. 14, a lower electrode 290 may be provided or formed on the organic insulating layer 275. The lower electrode 290 may be connected to the connection pattern 370 through the first contact hole of the organic insulating layer 275 and the second contact hole of the light absorbing layer 350. The lower electrode 290 may be formed using a metal, an alloy of a metal, a metal nitride, a conductive metal oxide or a transparent conductive material, for example. Such materials may be used alone or in combination with each other. Alternatively, the lower electrode 290 may have a multilayer structure including a plurality of layers.

A pixel defining layer 310 may be provided or formed on a part of the lower electrode 290 and the organic insulating layer 275. The pixel defining layer 310 may cover the both sides of the lower electrode 290, and may expose a part of the top surface of the lower electrode 290. The pixel defining layer 310 may include or be formed using an organic material.

A light emitting layer 330 may be provided or formed on the lower electrode 290 exposed by the pixel defining layer 310. The light emitting layer 330 may be formed using at least one of the light emitting materials for emitting the different color lights according to the sub-pixels. Alternatively, the light emitting layer 330 may be formed by laminating a plurality of light emitting materials for emitting the different color lights, such as a red light, a green light or a blue light, to emit a white light as a whole. In such an embodiment, the color filter may be provided or formed on the light emitting layer 330. The color filter may include at least one of the red color filter, the green color filter, and the blue color filter. Alternatively, the color filter may include the yellow color filter, the cyan color filter, and the magenta color filter. The color filter may be formed using a photosensitive resin or a color photoresist, for example.

An upper electrode 340 may be provided or formed on the pixel defining layer 310 and the light emitting layer 330. The upper electrode 340 may cover the light emitting layer 330 and the pixel defining layer 310, and may be provided or formed on the light emitting layer 330 and the pixel defining layer 310. The upper electrode 340 may be formed using a metal, an alloy of a metal, a metal nitride, a conductive metal oxide or a transparent conductive material, for example. Such materials may be used alone or in combination with each other. Alternatively, the upper electrode 340 may have a multilayer structure including a plurality of layers.

Accordingly, a sub-pixel structure 200 including the lower electrode 290, the light emitting layer 330, and the upper electrode 340 may be provided or formed as described above.

A first thin film encapsulation layer 451 may be provided or formed in the light emitting region 30 on the upper electrode 340. The first thin film encapsulation layer 451 may cover the upper electrode 340 in the light emitting region 30, and may be formed along the profile of the upper electrode 340 with a uniform thickness. The first thin film encapsulation layer 451 may effectively prevent the sub-pixel structure 200 from being deteriorated due to the penetration of moisture, oxygen, etc. In such an embodiment, the first thin film encapsulation layer 451 may function to protect the sub-pixel structure 200 from an external impact. The first thin film encapsulation layer 451 may be formed using a flexible inorganic material.

A second thin film encapsulation layer 452 may be provided or formed in the light emitting region 30 on the first thin film encapsulation layer 451. The second thin film encapsulation layer 452 may improve the flatness of the OLED display device 100, and may protect the sub-pixel structure 200. The second thin film encapsulation layer 452 may be formed using a flexible organic material.

A third thin film encapsulation layer 453 may be provided or formed in the light emitting region 30 on the second thin film encapsulation layer 452. The third thin film encapsulation layer 453 may cover the second thin film encapsulation layer 452 in the light emitting region 30, and may be formed along the profile of the second thin film encapsulation layer 452 with a uniform thickness. The third thin film encapsulation layer 453 may effectively prevent the sub-pixel structure 200 from being deteriorated due to the penetration of moisture, oxygen, etc., together with the first thin film encapsulation layer 451. In such an embodiment, the third thin film encapsulation layer 453 may function to protect the sub-pixel structure 200 from an external impact together with the first thin film encapsulation layer 451 and the second thin film encapsulation layer 452. The third thin film encapsulation layer 453 may be formed using a flexible inorganic material. Alternatively, the encapsulation substrate may be provided or formed on the upper electrode 340 in place of the thin film encapsulation structure 450. The encapsulation substrate may be formed using a quartz substrate, a synthetic quartz substrate, a calcium fluoride substrate, a fluorine-doped quartz substrate, a soda lime glass substrate or a non-alkali glass substrates, for example.

Accordingly, a thin film encapsulation structure 450 including the first thin film encapsulation layer 451, the second thin film encapsulation layer 452, and the third thin film encapsulation layer 453 may be provided or formed as described above. Alternatively, the thin film encapsulation structure 450 may have a five-layers structure formed by laminating first to fifth thin film encapsulation layers or a seven-layers structure formed by laminating first to seventh thin film encapsulation layers.

After the thin film encapsulation structure 450 is formed, the glass substrate 105 may be removed from the substrate 110, and the OLED display device 100 shown in FIG. 4 may be manufactured.

In an exemplary embodiment of the method of manufacturing the organic light emitting diode display device according to the invention, the second contact hole may be formed in the light absorbing layer 350 by forming the organic insulating layer 275 having the first contact hole on the light absorbing layer 350. Accordingly, organic light emitting diode display device includes the light absorbing layer 350, so that the light incident on the second active layer 135 may be blocked.

Figure 15:
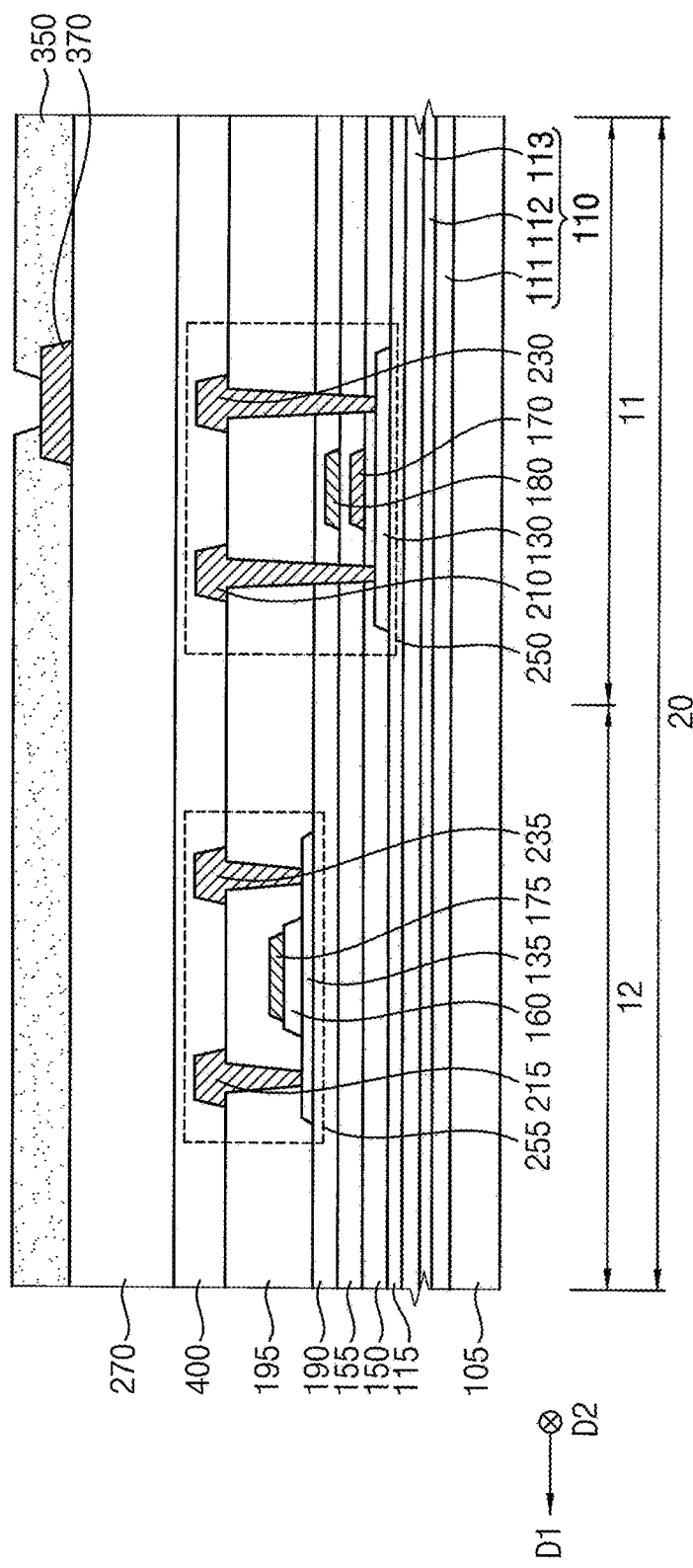
Figure 16:
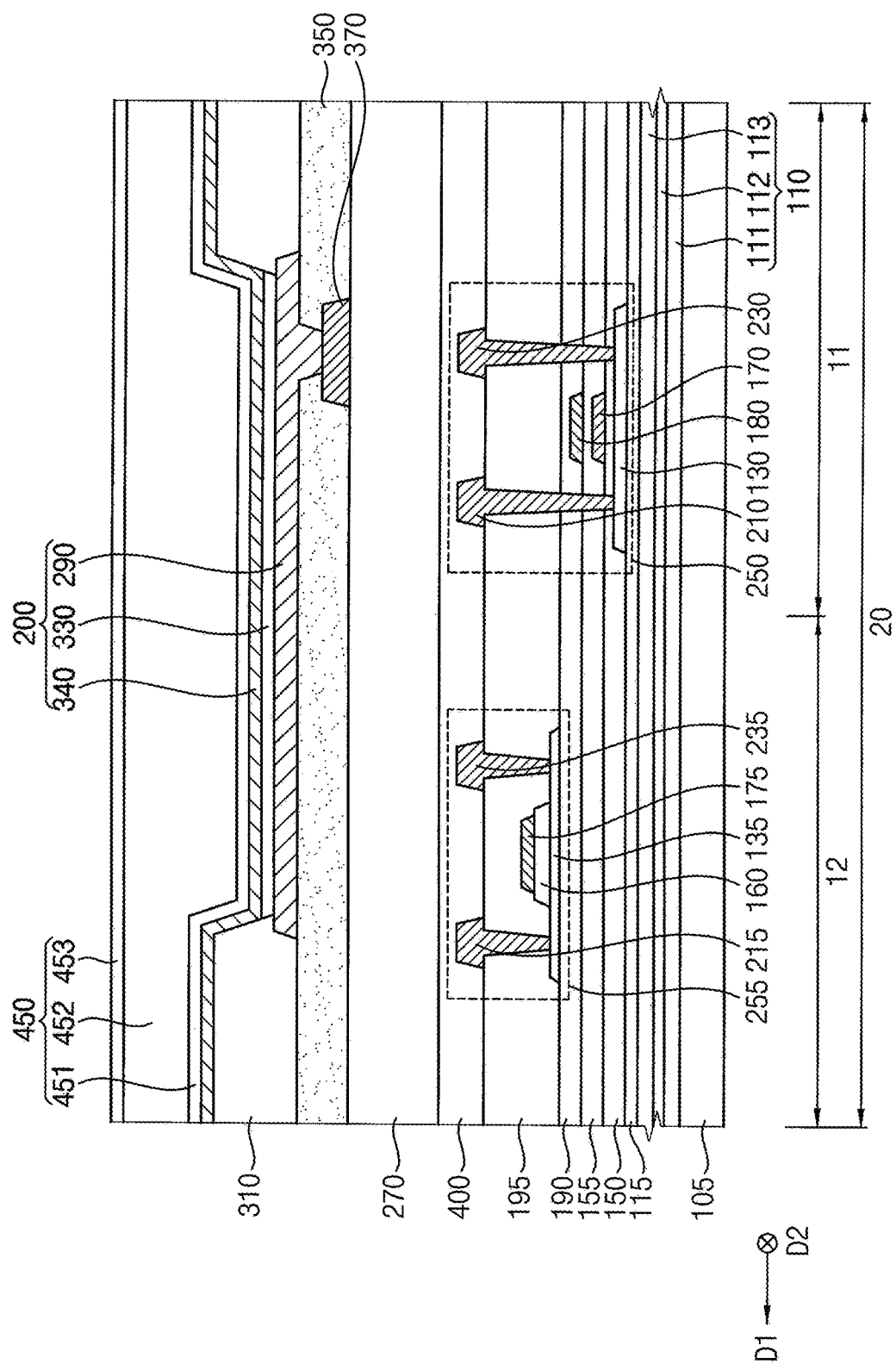

In an alternative exemplary embodiment, when the first thickness T1 of the organic insulating layer 275 of FIG. 9 is relatively small, during the dry etching process, the organic insulating layer 275 may be completely removed from the light absorbing layer 350 as shown in FIG. 15. In such an embodiment, as shown in FIG. 16, the organic light emitting diode display device may not include the organic insulating layer 275. In such an embodiment, the top surface of the light absorbing layer 350 may make direct contact with a bottom surface of the pixel defining layer 310 and a bottom surface of the lower electrode 290.

Figure 17:
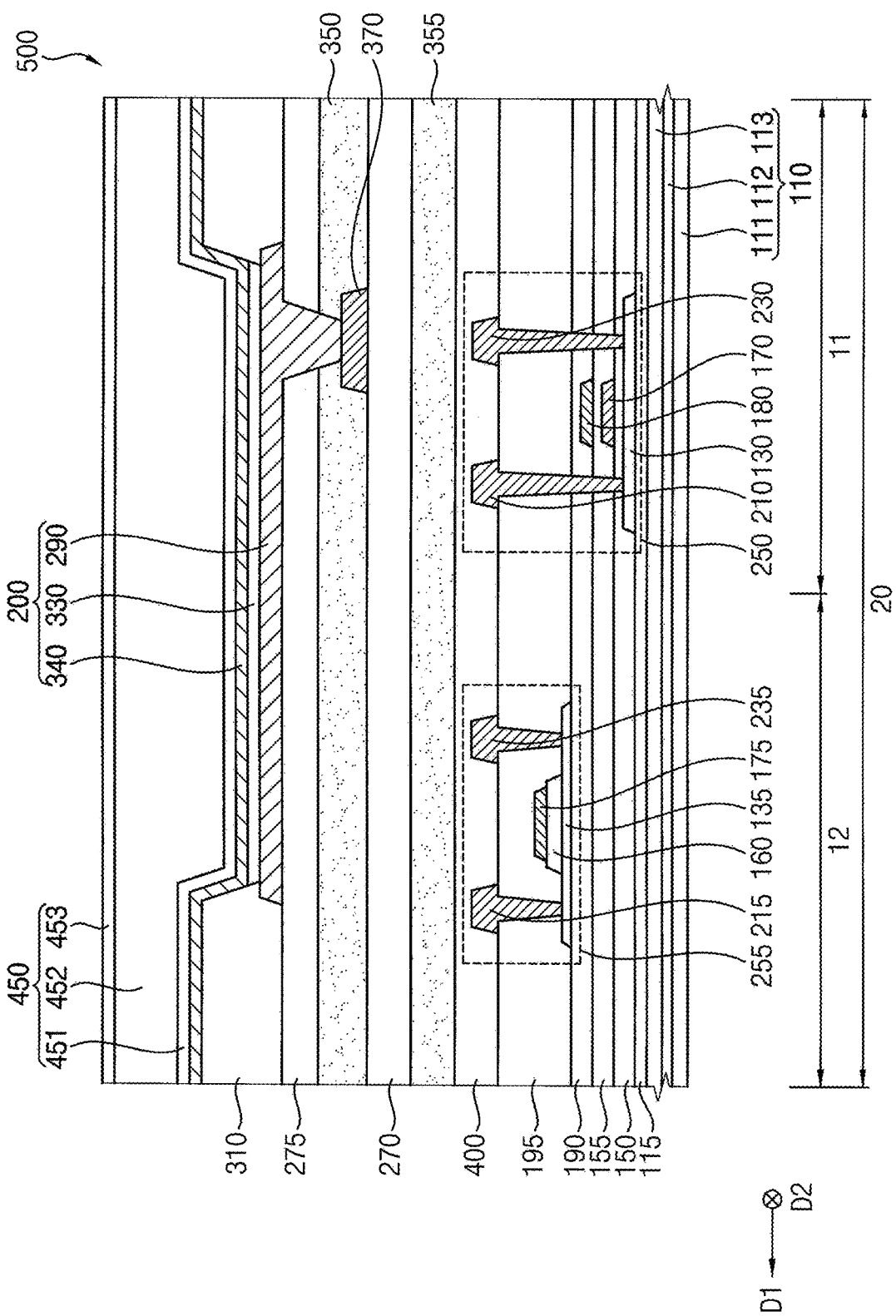
FIG. 17 is a sectional view showing an organic light emitting diode display device according to an alternative exemplary embodiment of the invention.

FIG. 17 is a sectional view showing an organic light emitting diode display device according to an alternative exemplary embodiment of the invention. An OLED display device 500 illustrated in FIG. 17 may have a configuration substantially identical or similar to the OLED display device 100 described with reference to FIGS. 1 to 4 except for a first light absorbing layer 355 and a second light absorbing layer 350. For convenience of description, any repetitive detailed description of elements substantially identical or similar to the elements described above with reference to FIGS. 1 to 4 will be omitted or simplified.

Referring to FIG. 17, an exemplary embodiment of an OLED display device 500 may include a substrate 110, a buffer layer 115, a driving transistor 250, a switching transistor 255, a gate electrode pattern 180, a first gate insulating layer 150, a second gate insulating layer 155, a first insulating interlayer 190, an insulating pattern 160, a second insulating interlayer 195, a protective insulating layer 400, a first light absorbing layer 355, a planarization layer 270, a connection pattern 370, a second light absorbing layer 350, an organic insulating layer 275, a sub-pixel structure 200, a pixel defining layer 310, a thin film encapsulation structure 450, etc.

The first light absorbing layer 355 may be disposed on the protective insulating layer 400. In such an embodiment, the first light absorbing layer 355 may be disposed on the protective insulating layer 400. In an exemplary embodiment, the first light absorbing layer 355 may effectively prevent external light penetrating into the OLED display device 500 from being incident on the second active layer 135, and may prevent a part of light, which is emitted from the light emitting layer 330, from being reflected from the upper electrode 340 so as to be incident on the second active layer 135. The first light absorbing layer 355 may include an organic material such as photoresist, a polyacryl-based resin, a polyimide-based resin, a polyamide-based resin, a siloxane-based resin, an acryl-based resin or an epoxy-based resin. In such an embodiment, the first light absorbing layer 355 may be substantially opaque. In one exemplary embodiment, for example, the first light absorbing layer 355 may further include a light shielding material for absorbing the external light. The light shielding material may include carbon black, titanium nitride oxide, titanium black, phenylene black, aniline black, cyanine black, nigrosine acid black or a black resin, for example.

The planarization layer 270 may be disposed on the first light absorbing layer 355. In such an embodiment, the planarization layer 270 may be disposed on the first light absorbing layer 355. In one exemplary embodiment, for example, the planarization layer 270 may have a relatively thick thickness to sufficiently cover the first light absorbing layer 355, and in such an embodiment, the planarization layer 270 may have a substantially flat top surface. In such an embodiment, a planarization process may be additionally performed on the planarization layer 270 to implement such a flat top surface of the planarization layer 270. The planarization layer 270 may include an organic material or an inorganic material. In an exemplary embodiment, the planarization layer 270 may include the organic material.

The second light absorbing layer 350 may be disposed on the planarization layer 270 and a part of the connection pattern 370. The second light absorbing layer 350 may cover both sides of the connection pattern 370, and may have a contact hole for exposing a part of a top surface of the connection pattern 370. In an exemplary embodiment, the second light absorbing layer 350 may effectively prevent the external light penetrating into the OLED display device 500 from being incident on the second active layer 135, and may prevent a part of the light, which is emitted from the light emitting layer 330, from being reflected from the upper electrode 340 so as to be incident on the second active layer 135. The second light absorbing layer 350 may include a material identical to the material of the first light absorbing layer 355.

An exemplary embodiment of The OLED display device 500 according to the invention includes the first light absorbing layer 355 and the second light absorbing layer 350 for absorbing light, such that the external light penetrating into the OLED display device 500 and the part of the light emitted from the light emitting layer 330 may be effectively or substantially completely absorbed. In such an embodiment, a single light absorbing layer of the OLED display device 100 of FIG. 4 may absorb about 90% of the light incident on the light absorbing layer. In an alternative exemplary embodiment, the OLED display device 500 of FIG. 17 including two light absorbing layers may absorb substantially entire (e.g., about 100%) of the light incident on the light absorbing layers. Accordingly, the OLED display device 500 may protect the second active layer 135 including an oxide-based semiconductor, and characteristics of the switching transistor 255 including the second active layer 135 may not be changed.

Exemplary embodiments of the invention may be applied to various display devices including an OLED display device, e.g., vehicle-display device, a ship-display device, an aircraft-display device, portable communication devices, display devices for display or for information transfer, a medical-display device, etc The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. An organic light emitting diode display device comprising:
   a substrate, a first region and a second region;
   a driving transistor disposed in the first region on the substrate and including:
      a first active layer including a first channel region;
      a first gate electrode overlapping the first channel region and on the first active layer;
      a first source or drain electrode disposed on the first gate electrode;
   a switching transistor disposed in the second region on the substrate and including:
      a second active layer including a second channel region;
      a second gate electrode overlapping the second channel region and on the second active layer;
      a second source or drain electrode disposed on the second gate electrode;
   a continuous planarization layer disposed on and covering a top surface of each of the first source or drain electrode and the second source or drain electrode facing away from the substrate;
   a first light absorbing layer disposed on the planarization layer;
   an organic insulating layer disposed directly on the first light absorbing layer;
   a sub-pixel structure disposed on the organic insulating layer and including:
      a lower electrode;
      a light emitting layer disposed on the lower electrode; and
      an upper electrode disposed on the light emitting layer;
   a pixel defining layer disposed between the organic insulating layer and the upper electrode and covering both lateral portions of the lower electrode;
   a connection pattern disposed between the planarization layer and the first light absorbing layer,
   wherein the organic insulating layer transmit light incident thereon therethrough the organic insulating layer,
   wherein the first active layer includes a silicon-based semiconductor, and the second active layer includes a metal-oxide-based semiconductor, and
   wherein the first active layer, the second active layer, the first gate electrode, and the second gate electrode are disposed on different layers to each other, and the first source or drain electrode and the second source or drain electrode are disposed on a same layer.

2. The organic light emitting diode display device of claim 1, wherein each of the driving and switching transistors has a top gate structure.

3. The organic light emitting diode display device of claim 1, further comprising:
   an insulating pattern disposed between the second active layer and the second gate electrode.

4. The organic light emitting diode display device of claim 1, further comprising:
   a first gate insulating layer disposed on the substrate to cover the first active layer in the first region; and
   a second gate insulating layer disposed on the first gate insulating layer to cover the first gate electrode in the first region.

5. The organic light emitting diode display device of claim 4, wherein the driving transistor further includes a gate electrode pattern overlapping the first gate electrode on the second gate insulating layer.

6. The organic light emitting diode display device of claim 5, further comprising:
   a first insulating interlayer disposed on the second gate insulating layer to cover the gate electrode pattern in the first region; and
   a second insulating interlayer disposed on the first insulating interlayer to cover the second active layer and the second gate electrode in the second region.

7. The organic light emitting diode display device of claim 6, wherein the first source or drain electrode and the second source or drain electrode are disposed on the second insulating interlayer.

8. The organic light emitting diode display device of claim 1, further comprising:
   a protective insulating layer disposed on the first source or drain electrode and the second source or drain electrode and disposed under the planarization layer; and
   a second light absorbing layer disposed between the protective insulating layer and the planarization layer.

9. The organic light emitting diode display device of claim 1, wherein the substrate includes:
   a first organic layer;
   a barrier layer disposed on the first organic layer; and
   a second organic layer disposed on the barrier layer.

10. The organic light emitting diode display device of claim 9, further comprising:
    a buffer layer disposed on the substrate between the substrate and the driving and switching transistors.

11. The organic light emitting diode display device of claim 1, further comprising:

a thin film encapsulation structure disposed on the sub-pixel structure,
wherein the thin film encapsulation structure includes:
  a first thin film encapsulation layer including a flexible inorganic material;
  a second thin film encapsulation layer disposed on the first thin film encapsulation layer and including a flexible organic material; and
  a third thin film encapsulation layer disposed on the second thin film encapsulation layer and including a flexible inorganic material.

* * * * *